United States Patent
Muranaka

(10) Patent No.: US 6,823,485 B1
(45) Date of Patent: Nov. 23, 2004

(54) SEMICONDUCTOR STORAGE DEVICE AND TEST SYSTEM

(75) Inventor: Masaya Muranaka, Akishima (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 09/830,362

(22) PCT Filed: Nov. 5, 1998

(86) PCT No.: PCT/JP98/04985
§ 371 (c)(1),
(2), (4) Date: Apr. 25, 2001

(87) PCT Pub. No.: WO00/28547
PCT Pub. Date: May 18, 2000

(51) Int. Cl.$^7$ ............................ G11C 29/00; G11C 7/00; G01R 31/26; G01R 31/27
(52) U.S. Cl. ...................... 714/719; 324/73.1; 324/765; 365/201
(58) Field of Search ................................ 714/718–723; 324/73.1, 765; 365/201

(56) References Cited

U.S. PATENT DOCUMENTS 4,994,732 A * 2/1991 Jeffrey et al. .............. 324/73.1
5,774,472 A * 6/1998 Matsuoka ................... 714/718
6,195,771 B1 * 2/2001 Tanabe et al. .............. 714/718

FOREIGN PATENT DOCUMENTS

JP          8-315598         11/1996

OTHER PUBLICATIONS

Increased throughput for the testing and repair of RAMs with redundancy Haddad, R.W.; Dahbura, A.T.; Sharma, A.B.; ☐☐ Computers, IEEE Transactions on , vol.: 40 Issue: 2 , Feb. 1991 Page(s): 154–166.*

* cited by examiner

Primary Examiner—Guy J. Lamarre
Assistant Examiner—Cynthia Britt
(74) Attorney, Agent, or Firm—Antonelli, Terry, Stout & Kraus, LLP

(57) ABSTRACT

A memory circuit having a memory cell array in which a plurality of memory cells are provided at intersection points of a plurality of word lines and a plurality of bit line pairs and a peripheral circuit for performing an operation of selecting an address is provided with a computing circuit for generating an address signal for test; a packet decoder for designating the kind of computation to the computing circuit; and an input circuit for supplying a test signal comprising a plurality of bits for designating a test operation to the packet decoder.

14 Claims, 12 Drawing Sheets

FIG. 3

| PACKET | | | | FUNCTION | OPERAND |
|---|---|---|---|---|---|
| CODE | | | | | |
| 0 | 0 | 1 | 0 | NOP | |
| 0 | 0 | 1 | 1 | PRE | |
| 0 | 1 | 0 | 0 | READ | yreg=0 |
| 0 | 1 | 0 | 1 | | yreg=hold |
| 0 | 1 | 1 | 0 | | yreg+=BL |
| 0 | 1 | 1 | 1 | | yreg-=BL |
| 1 | 0 | 0 | 0 | WRIT | yreg=0 |
| 1 | 0 | 0 | 1 | | yreg=hold |
| 1 | 0 | 1 | 0 | | yreg+=BL |
| 1 | 0 | 1 | 1 | | yreg-=BL |
| 1 | 1 | 0 | 0 | ACTV | xreg=0 |
| 1 | 1 | 0 | 1 | | xreg=hold |
| 1 | 1 | 1 | 0 | | xreg+=XL |
| 1 | 1 | 1 | 1 | | xreg-=XL |

| REGISTER OPERATION | | | |
|---|---|---|---|
| CURRENT CYCLE | | NEXT CYCLE | |
| xreg | yreg | xreg | yreg |
| X | Y | X | Y |
| X | Y | X | Y |
| X | Y | X | 0 |
| X | Y | X | Y |
| X | Y | X | Y+BL |
| X | Y | X | Y-BL |
| X | Y | X | 0 |
| X | Y | X | Y |
| X | Y | X | Y+BL |
| X | Y | X | Y-BL |
| X | Y | 0 | Y |
| X | Y | X | Y |
| X | Y | X+XL | Y |
| X | Y | X-XL | Y |

FIG. 4

| PAD NAME | OPTION-3 |
|---|---|
| CLK | CLOCK |
| CKE | |
| CS/ | CHIP SELECT |
| RAS/ | |
| CAS/ | |
| WE/ | |
| A13 | |
| ⌇ | |
| A0 | |
| DQ4 | |
| ⌇ | |
| DQ15 | |
| *VCCQ | |
| *VSSQ | |
| DQMU,L | |
| DQ0 | DATA INPUT/OUTPUT AND COMMAND INPUT |
| DQ1 | |
| DQ2 | |
| DQ3 | |
| VBB | SUBSTRATE POTENTIOL |
| VPP | WORD LINE BOOST POTENTIAL |
| VDLP | PERIPHERAL CIRCUIT POTENTIAL |
| VDLA | ARRAY POTENTIAL |
| VBLR | BIT LINE PRECHRGE POTENTIAL |
| VPLT | PLATE POTENTIAL |
| *VCC | EXTERNAL POWER SOURCE |
| *VSS | EXTERNAL POWER SOURCE |
| CKEP | MODE ENTRY PAD |
| | 15 pins |

SEMICONDUCTOR STORAGE DEVICE AND TEST SYSTEM

TECHNICAL FIELD

The present invention relates to a semiconductor memory device and a test system and, mainly, a technique effective for use in a technique of a probing test on a dynamic RAM (Random Access Memory).

BACKGROUND ART

An example of a memory integrated circuit capable of realizing the functions of a timing margin test, a voltage margin test, and detection of abnormal current by built-in functions is disclosed in the publication of Japanese Unexamined Patent Application No. Hei 8(1996)-315598. A memory integrated circuit of the publication has therein a built-in test function (BIST) unit for generating a memory test signal and various control signals, a timing generation circuit and a voltage generation circuit which are controlled by an output signal of the sequence unit, and a current sensor for detecting an abnormal current, in which a current-to-voltage converting circuit and an analog-to-digital converting circuit are connected in series.

In the memory integrated circuit having therein, in addition to the test built-in function unit, timing generation circuit, a voltage generation circuit, a current-to-voltage converting circuit, and a current sensor, the scale of the test circuit occupying the memory integrated circuit is large; and, moreover, since the test circuit is used only at the time of a test, there are problems in that the chip size is enlarged, in terms of storage bits as the inherent function of the memory integrated circuit, and the current consumption is increased. The publication indicates that the problems of the circuit scale and the like are solved by a relative decrease in the test circuit area in association with a finer circuit and an increase in the capacity of the memory. However, it is not realistic to allow a large-scale test circuit, as described above, to be built in a general memory, such as dynamic RAM having storage capacity of about 64 Mbits or 256 Mbits as practically used at present.

The throughput of a probing test on a dynamic RAM or the like is determined by test time per chip and the number of chips (the number of chips simultaneous measured). The number of chips simultaneous measured is, however, under constraints of each of various hardware. For example, the number of bonding pads of a synchronous DRAM (Dynamic RAM) of 64 Mbits is equal to at least 60 to 70 which is the sum of about 54 of external terminals except for NC pins and special pads used for a probing test.

On the other hand, the maximum number of needles of a probe card to be electrically connected to the bonding pads is about 1,000 to 1,500. Accordingly, the maximum number of devices to be measured simultaneously is about 20. When the number of devices to be simultaneously measured increases, the number of generating times of signals, the number of comparators, and the number of power units on the tester side are also increased, thereby raising the price of the tester. Further, it causes problems such that the cost of a multi-needle probe card increases and the life becomes shorter. Consequently, it is not easy to increase the number of devices to be simultaneously measured.

The inventors of the present invention have therefore examined solution of the problems while minimizing the number of needle pads used for a probing test. In association with the increase in the diameter of a wafer in recent years, the number of memory chips obtained is conspicuously increasing. It is estimated that the number of chips to be simultaneously measured has to be increased more and more. As methods of decreasing the number of needle pads at the time of a probing test, reduction in the number of power source needle pads, reduction in the number of data input/output pads, reduction in the number of address input pads, and reduction in the number of clock input pads can be mentioned. The power source pads can be eliminated by connecting the power source in a memory chip except for a pair of VCC and VSS as long as the characteristics can be maintained. If the address input pads and clock input pads are eliminated, however, tests of reading and writing data from/to a memory by designating an address cannot be conducted. A method of designating memory access patterns such as matching patterns by a simple control from the outside and generating them on the inside may be considered. It is, however, estimated that the logic in the chip becomes large and complicated, it causes an increase in chip size and deterioration in yield, and the method does not contribute to reduction in cost as a total.

An object of the invention is, therefore, to provide a semiconductor memory device and a test system capable of conducting a memory test with a simple configuration. Another object of the invention is to provide a semiconductor memory device and a test system capable of conducting a probing test with a smaller number of needle pads. Further another object of the invention is to provide a semiconductor memory device and a test system capable of simultaneously measuring the increased number of chips. The above and other objects and novel features of the invention will become apparent from the description of the specification and the attached drawings.

DISCLOSURE OF THE INVENTION

A representative technique of the present invention disclosed in the specification will be briefly described as follows. A memory circuit having a memory cell array in which a plurality of memory cells are provided at intersection points of a plurality of word lines and a plurality of bit line pairs and a peripheral circuit for performing an operation of selecting an address is provided with: an arithmetic unit which is also called an arithmetic circuit, a computing unit or a computing circuit below for generating an address signal for a test on the memory circuit; a packet decoder for designating the kind of operation on the arithmetic unit; and an input circuit for supplying a test signal comprising a plurality of bits for designating a test operation to the packet decoder.

BRIEF DESCRIPTION OF THE DRAWINGS

FIG. 3 is a diagram for explaining bit patterns corresponding to the format A of FIG. 2 and their operations;

FIG. 4 is a diagram of the structure of pads of an SDRAM according to the invention as an example;

BEST MODE FOR CARRYING OUT THE INVENTION

The invention will be described in more detail with reference to the attached drawings.

Figure 1:
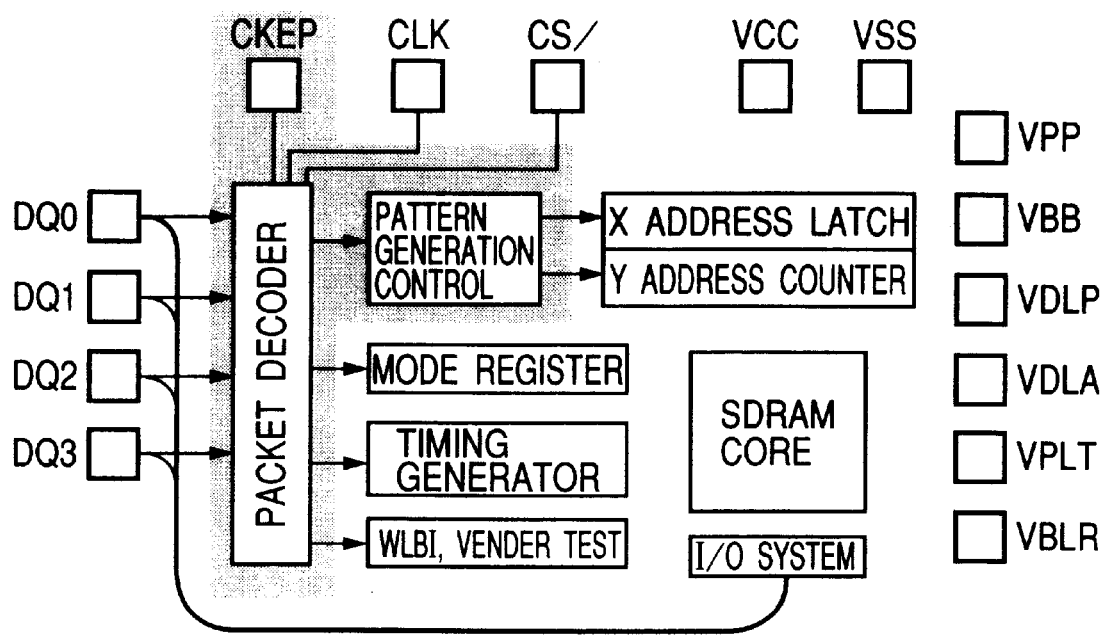
FIG. 1 is a block diagram related to a test circuit of an example of a semiconductor memory device according to the invention.

FIG. 1 is a block diagram related to a test circuit of an example of a semiconductor memory device according to the invention. The embodiment is directed to, although not particularly limited, a synchronous dynamic RAM (which may be simply called an SDRAM hereinbelow).

An SDRAM core includes peripheral circuits such as a memory array and an address selection circuit. The SDRAM has, in addition to the above, an X address latch, a Y address counter, a mode register, a timing generator, and a vendor test. By controlling the components by a packet decoder and a pattern generation controlling circuit which construct a test circuit, a probing test is carried out.

In I/O (input/output) terminals provided in correspondence with the SDRAM core, four data input/output terminals DQ0 to DQ3 are used as terminals of input and output signals for test. A pad CKEP used for mode entry in control signals, a clock terminal CLK, and a chip select terminal CS/ are used to receive test signals from the terminals DQ0 to DQ3.

Only a pair of a source voltage terminal VCC for supplying a power and an earth terminal VSS of the circuit are used for a test. A pad VPP (step-up voltage), a pad VBB (substrate back-bias voltage), and pads VDLP, VDLA, VPLT, and VBLR (internal step-down voltage) for monitoring an internal voltage are provided for a probing test. As a result, in the SDRAM of the embodiment, irrespective of the storage capacity of about 64 Mbits as will be described hereinlater, the number of electrodes (pads) used for a test can be decreased to 15.

In the embodiment, test signals of four bits supplied from the data input/output terminals DQ0 to DQ3 are formed as a packet (packet of information), and setting of all of operation controls for testing the SDRAM is realized by a single test signal or a combination of test signals. The test signal is supplied to a packet decoder where the bit pattern is decoded. For example, the pattern generation control circuit generates and supplies an X address signal for selecting a word line to the X address latch, and generates and supplies a Y address for selecting a bit line to the Y address counter.

By combinations of test signals of four bits (one packet), 16 control signals can be generated at the maximum. By combining a part (n) of the control signal and the next packet, (n×16) control signals can be generated. Further, by combining unused parts (m) in the above two packets, (m×16) control signals can be generated. It is sufficient to generate all of control signals necessary for operations of testing a memory circuit.

To determine whether input signals supplied from the data input/output terminals DQ0 to DQ3 are the test signal or not, the pad CKEP is used. Specifically, by combining this signal CKEP, the clock signal CLK, and the chip select signal CS/, the data input signal in normal operation and a test signal in test operation are discriminated from each other.

With such a configuration, the number of pads necessary for electrical contact at the time of a testing operation is largely reduced to 15 per memory chip. By decreasing the number of contact pads in such a manner, the number of memory chips contacted simultaneously with a conventional probe card can be largely increased. The test time can be substantially largely shortened.

While increasing the number of chips to be measured simultaneously, and while assuring all of testing operations necessary for an operation test on a memory circuit by serially inputting one or a plurality of test signals as a packet, in order to make setting of an operation test at high speed, the following is devised.

The four data input/output terminals DQ0 to DQ3 are also used for outputting a test result. Although not particularly limited, the SDRAM has four memory banks, and a test is conducted by simultaneously operating the four memory banks. The test result generated every memory bank is outputted through the data input/output terminals DQ0 to DQ3. Therefore, test read data of every four memory banks is outputted and compared with an expectation value by an external tester.

Using four bits of signals to conduct a test is very convenient for the SDRAM. From the viewpoint of a testing operation, two bits are insufficient as information for setting a testing operation, as will be described hereinlater. A bit pattern of eight bits is too large, so that a waste occurs, and the number of test terminals increases.

Figure 2:
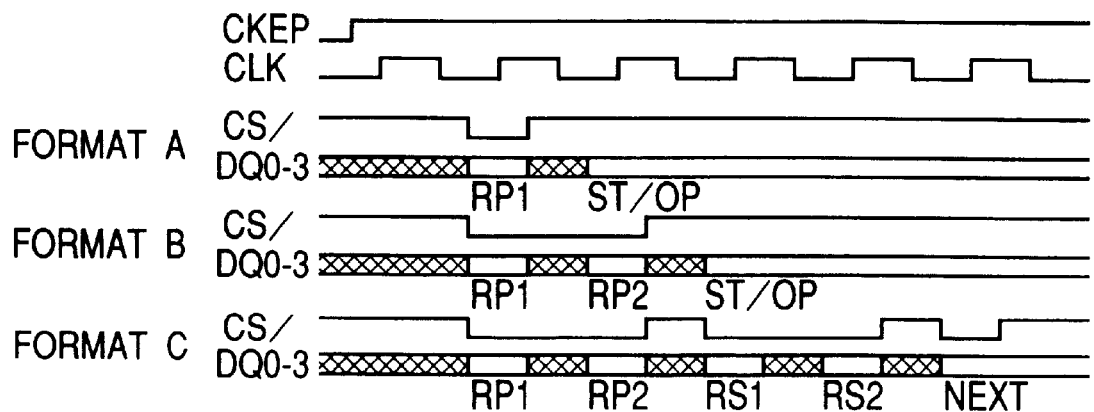
FIG. 2 is a timing chart showing an example of an input protocol of test signals in the semiconductor memory device according to the invention.

FIG. 2 is a timing chart of an example of an input protocol of test signals in a semiconductor memory device according to the invention.

In the embodiment, although not particularly limited, three formats A to C are prepared. The first format A is constructed by one cycle (one packet) in which an operation command of a high use frequency is set. The second format B is constructed by two cycles (two packets) in which an operation command of a low use frequency is set. The third format is constructed by four cycles (four packets) and is used to set various registers in a memory by combining two second formats.

In the first format A, an input mode of a test signal is designated by the high level of the clock CKEP, the high level of the clock signal CLK, and the low level of the chip select signal CS/. A packet decoder corresponding to the first format A receives a four-bit test signal (first primary signal) RP1 entered as a command itself from the data input/output terminals DQ0 to DQ3, decodes it, and starts operation ST/OP immediately in the second cycle.

In the second format B, similarly, by the high level of the signal CKEP, the high level of the clock signal CLK, and the low level of the chip select signal CS/, an input mode of the test signal is designated. The chip select signal CS/ is set to the low level for two cycles. A packet decoder corresponding to the second format B discriminates that a four-bit signal entered from the data input/output terminals DQ0 to DQ3 as the test signal (first primary signal) RP1 is "OTHR" (refer to the following), receives a four-bit test signal (second primary signal) RP2 entered in the second cycle as a command, decodes the test signal RP2, and starts operation ST/OP in the third cycle.

In the third format C, similarly, by the high level of the signal CKEP, the high level of the clock signal CLK, and the low level of the chip select signal CS/, the input mode of the test signal is designated. The chip select signal CS/ is set to the low level twice each time for two cycles. A packet decoder corresponding to the third format C discriminates that the four-bit test signal (first primary signal) RP1 entered from the data input/output terminals DQ0 to DQ3 is set to "OTHR" (refer to the following), receives the four-bit test signal (second primary signal) RP2 entered in the second cycle as information of a designated register, discriminates that a four-bit test signal (first secondary signal) RS1 entered in the third cycle is set to "REG" (register mode), receives a four-bit test signal (second secondary signal) RS2 entered in the fourth cycle as a command, and performs an operation on the register designated in the second cycle.

In the case of using the test signals (packets) as the primary (first) signals in two cycles and the secondary (latter) signals in two cycles, the configuration of the packet decoders can be made simpler as will be described hereinlater. In other words, by constructing the decoder in two stages in correspondence with the two cycles, the formats B and C can be constructed by similar circuits. The format A can be discriminated from the format B by the combination with the chip select signal CS/. In the format A, a command can be executed from the second cycle.

FIG. 3 is a diagram for explaining bit patterns corresponding to the format A in FIG. 2 and their operations.

To the format A, five commands of NOP (no operation), PRE (precharge), READ (read), WRIT (write), and ACTV (bank active) of a high use frequency in operation commands of an SDRAM are assigned. The READ and WRIT commands are accompanied with a column (Y) address control, and the ACTV command is accompanied with a row (X) address control.

For each of the three commands READ, WRIT, and ACTV, four kinds of address controls are performed. Specifically, in each of the commands READ and WRIT, "0" denotes that the Y address is set to 0, "hold" denotes that the address Y of the current cycle is held, +BL denotes that a value BL set in the register is added to the address Y of the current cycle (Y+BL), and −BL indicates that the value BL set in the register is subtracted from the address Y of the current cycle. In the ACTV command as well, in a manner similar to the above, "0" denotes that the X address is set to "0", "hold" denotes that the address X of the current cycle is held, +XL denotes that a value XL set in the register is added to the address X of the current cycle (Y+BL), and −XL denotes that a value XL set in the register is subtracted from the address X of the current cycle (X−XL).

By the command as described above, 14 bit patterns are used by the test signal (packet) of four bits. To the remaining two bit patterns, the above-described command "OTHR" instructing reference to the next packet and "REG" instructing a register mode are assigned.

In the format B, operation commands having not so high use frequency in the operation commands of the SDRAM, for example, eight commands of PALL (all bank precharge), CBR (automatic refresh), SELF (self refresh), BST (burst stop), PWRDN (power down mode), SELFX (self refresh end), and mode setting such as "auto precharge enable" and "auto precharge mode disable" are assigned. Although the bit patterns of the test signal RP2 with respect to the commands will not be described, 16 commands can be designated at the maximum by the combination with the test signal RP1=OTHR. Consequently, after assigning the above eight commands, eight commands are still available and can be used for setting the kind of a register of the format C.

In the format C, although each of the bit patterns will not be described, in the test signal RP2, any of the operation commands of the SDRAM is used as register setting. For example, setting of a mode register, selection of a bank, setting of a vendor test, or trimming select of VPP, VDLA, or VDLP is assigned. In the secondary test signal RS1, by combination with the test signal RS1 (=RP1) =REG, 16 register operations at the maximum with respect to each of the registers designated by the test signal RP2 can be set.

FIG. 4 is a diagram of the structure of pads of an SDRAM according to the invention as an example. In an SDRAM, pads corresponding to terminals to be connected with external terminals and pads used for a probing test are formed. Pads to be connected to external terminals are mounted on a package of 54 pins including three pairs of power source terminals *VCC and *VSS on both ends and the center of the package and two pairs of *VCCQ and *VSSQ for output circuit. As pads used for the test circuit according to the invention, as shown in FIG. 1, 15 pads are used which are the clock CLK, chip select CS/, data input/output DQ0 to DQ4, power sources VCC and VSS to be connected to the external terminals and, in addition, the substrate potential VBB, word line step-up voltage VPP, peripheral circuit potential VDLP, array potential VDLA, bit line precharge potential VBLR, plate potential VPLT, and mode entry pad CKEP.

That is, out of about 60 pads formed on an SDRAM, electrical contact is made on the 15 pads to conduct an operation test on a memory circuit.

Conversely, electrical contact is not made on the control terminals CKE, RAS/, CAS/, and WE/ and, in addition, the address terminals A0 to A13, the data input/output terminals DQ4 to DQ15, power source terminals VCCQ and VSSQ for output circuit, and mask terminals DQMU and DQML for input/output circuit with a blank in the option-3. By the test signal (packet) entered from the data input/output terminals DQ0 to DQ3, internal signals such as an operation command and an address signal of an SDRAM are generated.

Figure 5:
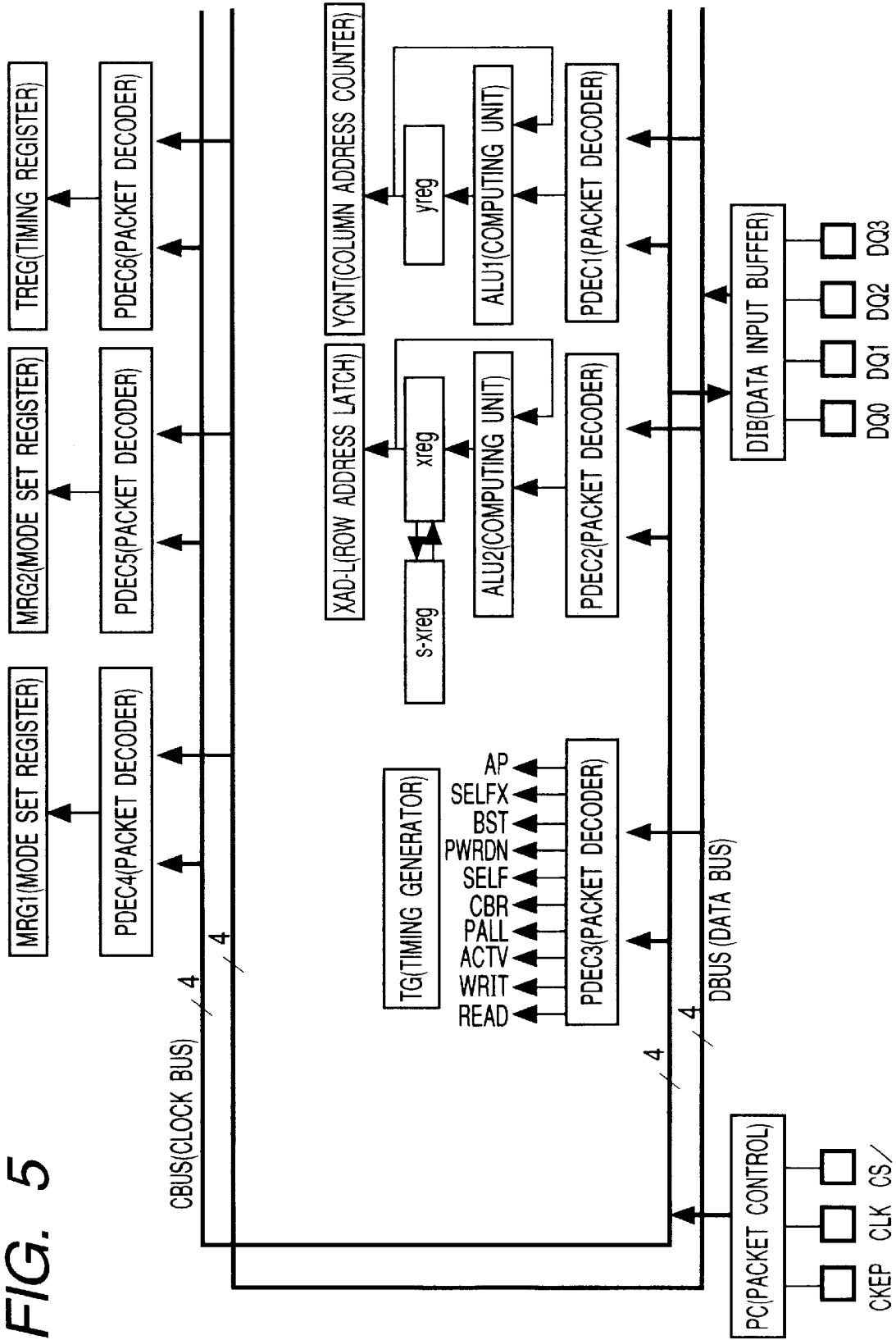
FIG. 5 is a block diagram showing an example of a test circuit mounted on the SDRAM according to the invention.

FIG. 5 is a block diagram showing an example of a test circuit to be mounted on the SDRAM according to the invention.

The test circuit includes a plurality of packet decoders provided in correspondence with circuits to be tested. Particularly, when a circuit to be tested is a row address latch XAD-L, as well as a packet decoder PDEC2, an arithmetic circuit ALU2 for generating a row address signal is added. To a column address counter YCNT, as well as a packet decoder PDEC1, an arithmetic circuit ALU1 for generating a column address signal is added.

For the computing circuit ALU2, a sub register s-xreg is provided. By using a configuration such that one of registers xreg and s-xreg is switched and connected to the computing circuit ALU2 and by allowing the sub resister s-xreg to generate a refresh address, switching between a test address and a refresh address can be easily made. It is also possible to use both of the two resisters for a testing operation and perform non-continuous address switching.

For a timing generator, a packet decoder PDEC3 is provided. For mode registers MRG1 and MRG2, packet decoders PDEC4 and PDEC5 are provided, respectively. For a timing generator TREG, a packet decoder PDEC6 is provided. In such a manner, a packet decoder is provided for each of the circuits necessary for a control for the testing operation, and the packet decoders PDEC1 to PDEC6 are connected to a data bus DBUS and a clock bus CBUS, in parallel.

Test signals entered from the data input/output terminals DQ0 to DQ3 are received via a data input buffer DIB and transferred to the data bus DBUS. Each of the packet decoders PDEC1 to PDEC6 therefore receives the entered test signal and, while discriminating whether the test signal is the command assigned to itself or not, executes the command.

A packet control PC receives signals from the mode entry pad CKEP, clock terminal CLK, and chip enable terminal CS/ and transmits a clock signal to the clock bus CBUS. Two out of four lines of the clock bus CBUS are used for clock signals JJB and KKB each obtained by frequency dividing the clock signal to the half. Synchronously with the clock signal JJP, the signals RP1 and RS1 are entered. Synchronously with the clock signal KKB, the signals RP2 and RS2 are entered.

The circuits for a test operation are spread to the circuit blocks necessary to be controlled as in the embodiment and simple circuits such as the packet decoders are provided adjacent to the circuits, thereby enabling gaps and empty spaces between circuit blocks to be utilized from the viewpoint of layout. Consequently, a substantial increase in chip area can be prevented.

Figure 6:
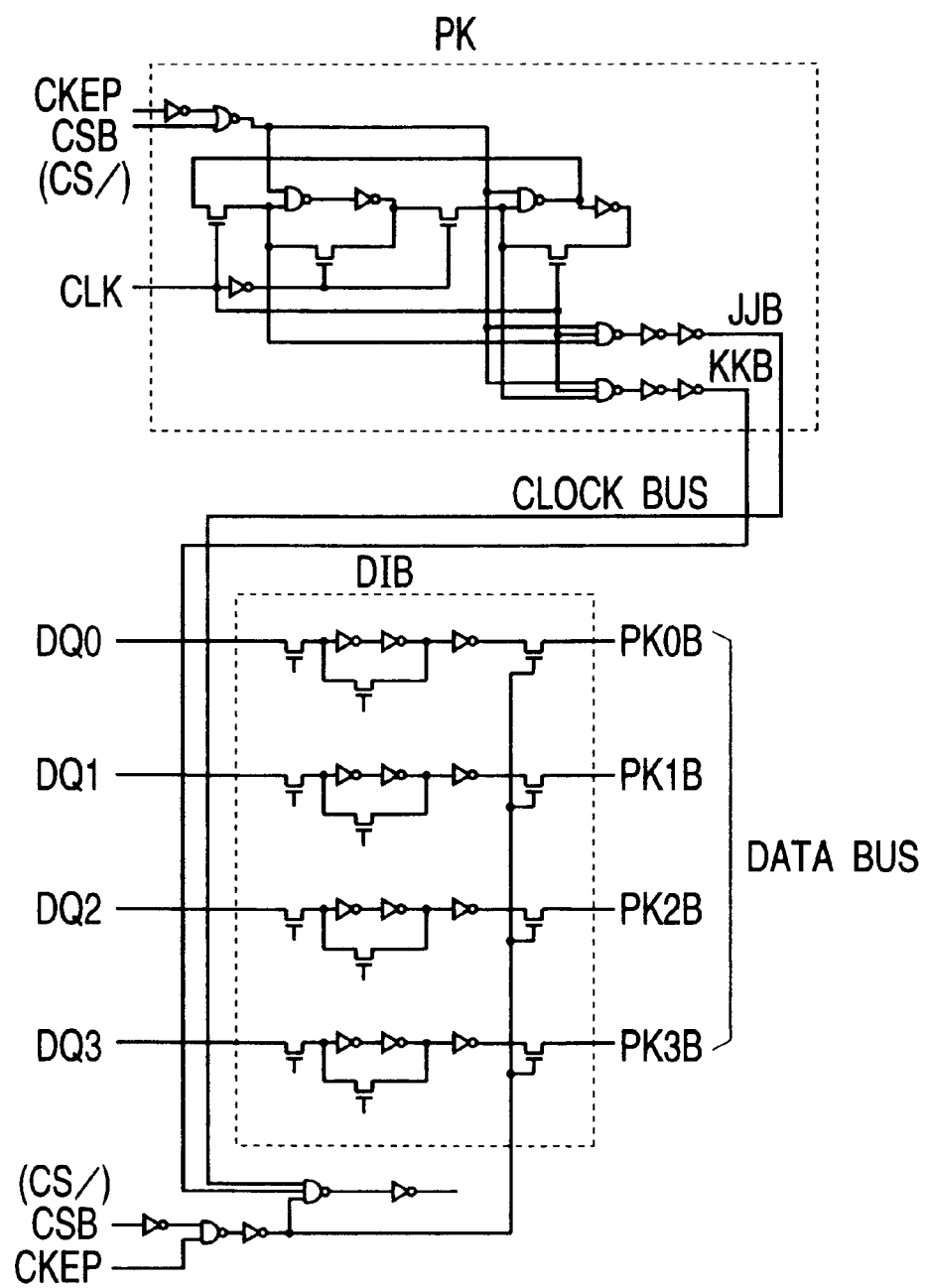
FIG. 6 is a circuit diagram showing an example of a packet control PC and a data input buffer DIB of FIG. 5.

FIG. 6 is a circuit diagram showing an example of the packet control PC and the data input buffer DIB in FIG. 5.

The data input buffer DIB has a data latch circuit for latching signals entered from the data input/output terminals DQ0 to DQ3. By the conditions of the low level of the chip select signal CSB (CS/) and the high level of the mode entry pad CKEP, a transfer MOSEET provided at an output section of the data latch circuit is turned on, and the entered signal is sent as a test signal to the data bus DBUS. The data latch circuit is constructed by a transfer gate MOSFET for transmitting an input signal to a serially connected CMOS inverter circuit and a transfer gate MOSFET for feedback which latches the CMOS inverter circuit.

The packet control PC takes the form of a binary counter circuit by using two through latch circuits similar to the above, and is made operative by the CKEP and CSB to perform an operation of frequency-dividing an input clock signal CLK, thereby generating two-phase clock signals JJB and KKB of which cycle is twice as many as that of the clock signal CLK and which are alternately outputted.

Figure 7:
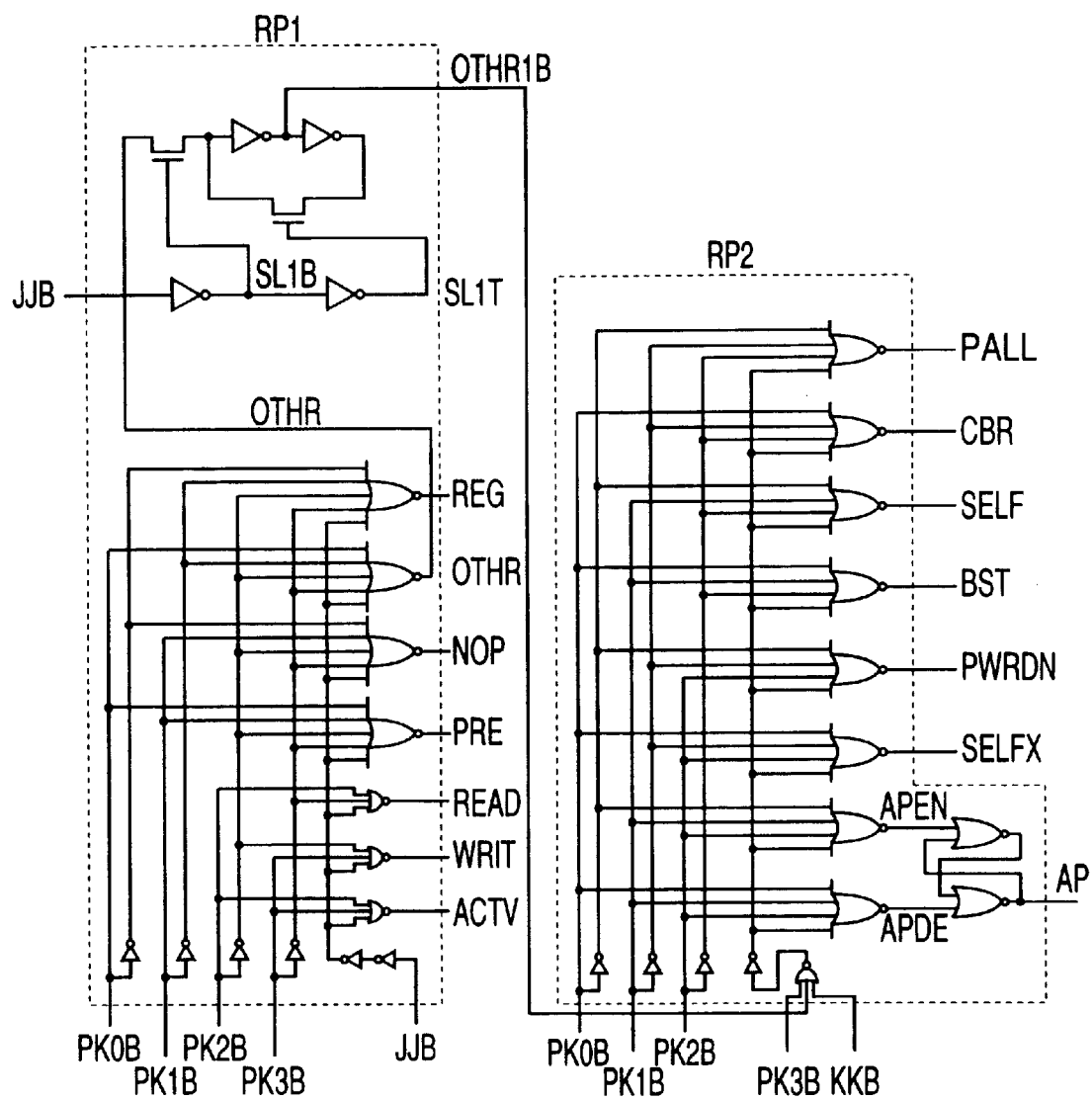
FIG. 7 is a circuit diagram showing an example of a packet decoder PDEC in FIG. 5.

FIG. 7 is a circuit diagram showing an example of the packet decoder PDEC in FIG. 5. In the diagram, decoders corresponding to the signals RP1 (RS1) and RP2 (RS2) are shown.

In the decoder corresponding to the format A, the signals READ, WRIT, and ACTV are generated by gate circuits for receiving signals PK2B and PK3B of the upper two bits from packet signals PK0B to PK3B of four bits supplied via the data input buffer DIB. The signals PK0B and PK1B of the lower two bits are decoded by gate circuits (not shown) and four commands (0, hold, + and −) are added to the signals READ, WRIT, and ACTV. An address control as described above using the arithmetic circuit ALU is also added. The commands of the precharge PRE, no operation NOP, other OTHR, and register mode REG are generated by the gate circuits for receiving the four-bit signals PK0B to PK3B. The clock signal JJB is supplied to the gate circuits for generating the commands, and input signals entered in the first and third cycles are decoded.

The signal OTHR is latched by the latch circuit on the basis of the clock signal JJB, and the operations of the gate circuits corresponding to the packet signals PK0B to PK3B are made effective by the signal OTHR and the clock signal KKB subsequently entered. By the gate circuits, signals of the commands PALL, CBR, SELF, BST, PWRDN, SELFX, APEN (auto precharge enable), and APDE (auto precharge disable) corresponding to the format B are generated. The signals APEN and APDE are supplied to a latch circuit constructed by a gate circuit where the auto precharge signal AP is generated.

Although not shown, in correspondence with the format C, a register is designated by combination of the remaining signals RP2, the command REG is generated by the signal RS1 supplied synchronously with the clock signal JJB of the next cycle, and a signal for operating the register is generated by a gate circuit for decoding the packet signals PK0B to PK3B supplied synchronously with KKB.

A plurality of gate circuits as described above are not constructed as one packet decoder. For example, the gate circuit for generating the commands READ and WRIT is included in the packet decoder PDEC1 provided adjacent to the column address counter shown in FIG. 5, and the gate circuit for generating the command ACTV is provided adjacent to the row address latch XAD-L shown in FIG. 5. The circuits for generating the commands are provided so as to be spread in the circuit blocks corresponding to the respective functions. As described above, the packet decoder is constructed by a simple gate circuit. By disposing the packet decoders so as to be spread to circuits to be controlled, gaps and empty spaces between circuit blocks can be utilized from the viewpoint of a layout. Consequently, a substantial increase in chip area can be prevented.

Figure 8:
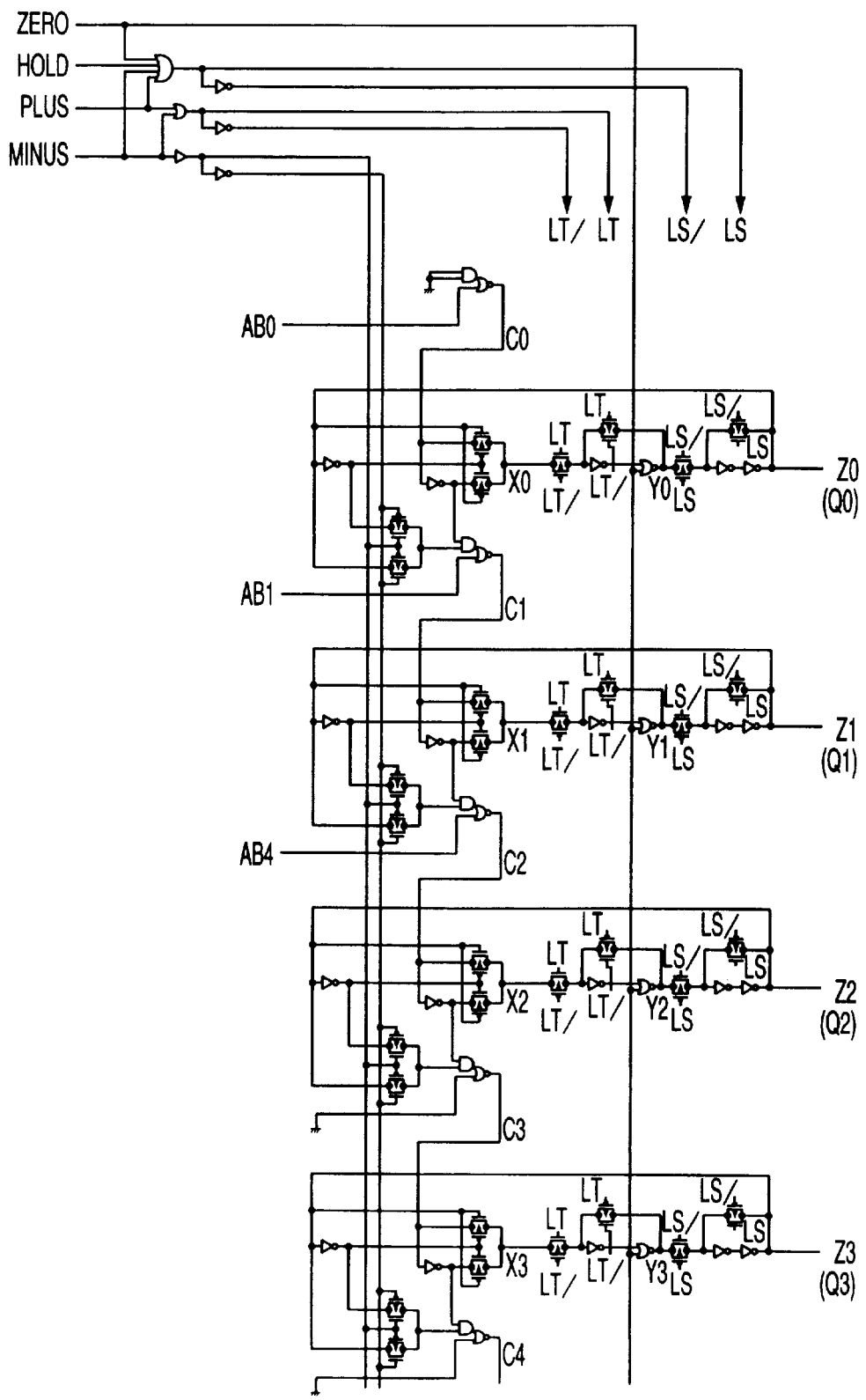
FIG. 8 is a circuit diagram showing an example of an arithmetic circuit ALU in FIG. 5.

FIG. 8 is a circuit diagram showing an example of the arithmetic circuit ALU in FIG. 5. In the example, a circuit of four bits is illustrated as a representative. The arithmetic circuit ALU in the example is to generate a row (X) address signal and a column (Y) address signal for a testing operation as described above. By limiting the function of the computing circuit ALU to generation of an address, therefore, attempt is made to simplify the circuit.

Specifically, an address signal for the testing operation is sufficiently generated by not only simple increase or decrease in an address such as +1 or −1 but also setting of addresses of a discrete number such as +2 or −2. In the example, the function of adding or subtracting a discrete number such as +4 or −4 is also added. By combining the functions, an address can be designated in a wide range. By adding "clear (0)" and "hold" for holding the preceding state, designation of all of addresses for a testing operation can be achieved.

By limiting the numbers of addition and subtraction to, for example, 1, 2, and 4 as described above, in an actual arithmetic circuit, an arithmetic circuit for each of the lower three bits can be realized by a simple circuit similar to a half adder for inverting a value and generating a carry when both of a value before addition and a value to be added are "1" or inverting the value before addition when it is 0 in an adding operation.

Specifically, two through latch circuits are connected in series, a gate circuit is used as the through latch circuit on the input side and is controlled by a control signal ZERO so that all of outputs of the latch circuit at the front stage are forcedly set to 0. The output signals Q0 to Q3 of the latch circuit on the output side and the like are fed back to the input side and used to control two pairs of transfer gate circuits. The first pair of transfer gate circuits is used to generate an addition output of the bit. With respect to the least significant bit, when both an addition signal AD1 and the output Q0 are "1", "0" is generated, and a carry is generated through the second pair of transfer gate circuits. When either the addition signal AD1 or the output Q0 is "1", the original values are used.

An adding operation is performed by operating the two latch circuits by a control signal PLUS to thereby generate the addition signal. A subtracting operation is realized by controlling the second pair of transfer gate circuits by a control signal MINUS to generate complement numbers such as the outputs Q0 to Q3, and adding addition signals AB2 and AB4. When a control signal HOLD becomes effective, control signals LS/ and LS of the latch circuit on the rear side are generated, and unchanged signals of the latch circuit on the front side are received as they are.

In the example, as a precondition, a simplified circuit as described above is used as the arithmetic circuit, and only one of the addition signals AB1, AB2, and AB4 becomes "1". The result of computation when an addition signal of 2 or larger is set to 1 by mistake is not therefore guaranteed. Although it is imperfect as a computing circuit, when the use is limited to generation of an address signal for a testing operation, the drawbacks are not so considered since the test circuit is used by a semiconductor manufacturer who knows the function very well. It is unnecessary to consider the case where the circuit is erroneously used.

Figure 9:
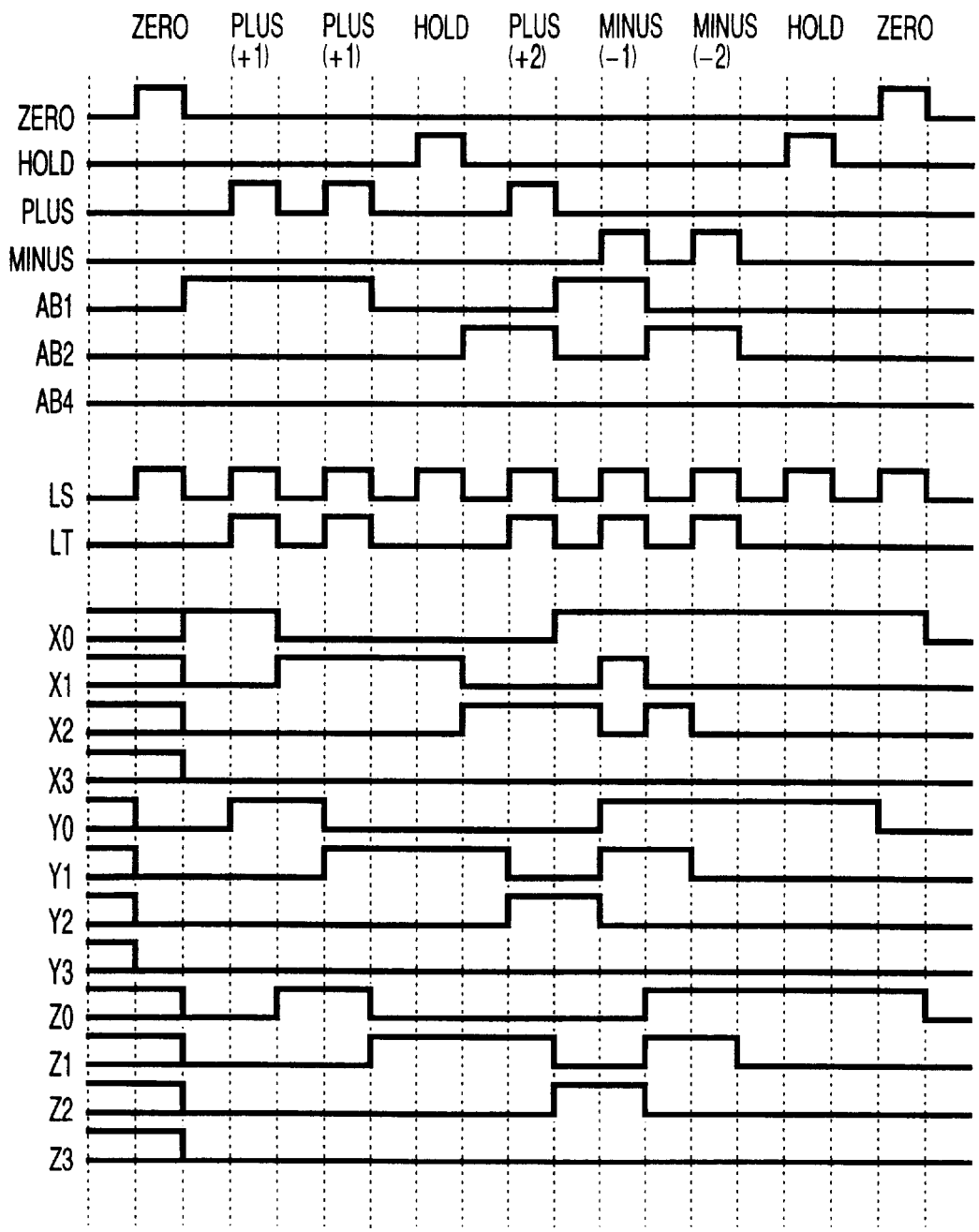
FIG. 9 is a waveform chart for explaining the operation of the arithmetic circuit ALU in FIG. 8.

FIG. 9 is a waveform chart for explaining an example of the operation of the arithmetic circuit.

When the control signal ZERO goes high, an output of the NOR gate circuit in the latch circuit on the front side in the computing circuit becomes 0, the clock signals LS and LS/ are generated and latched by the latch circuit on the output side, and all of the address signals become 0.

When the addition signal AB1 is set to the high level (1), an output node X0 of the first pair of transfer gate circuits becomes 1. When the control signal PLUS goes high, the clock signals LS and LT are generated, and an output node Y0 of the latch circuit on the front side becomes 1 in correspondence with 1 of the output node X0. When the control signal PULS goes low, the clock signal LS also changes, and an output signal Z0 (Q0) of the latch circuit at the rear side changes to 1. By the change in the output signal Z0, the two transfer gate circuits are switched, the output node X0 is changed to the low level "0" and the next bit X1 is changed to "1". Subsequently, when the control signal PLUS is set to the high level, the clock signals LS and LT are generated in a manner similar to the above, and the output node Y0 of the latch circuit on the front side is changed to "0", and the output node Y1 is changed to "1". When the control signal PULS goes low, the clock signal LS also changes, and the output signal Z0 (Q0) of the latch circuit on the back side is changed to 0, and the output signal Z1 (Q1) is changed to 1. In such a manner, the address signal increases by +1 each time. The addition signal AB1 is returned to the low level for the next operation.

When the control signal HOLD goes high, only the clock signal LS is generated, signals from the output nodes Y0 to Y3 and the like of the latch circuit on the front side are supplied to the latch circuit on the back side. Since the previous state is received as it is, no change occurs in outputs Z0 to Z3 (Q0 to Q3) and the like.

When the addition signal AB2 is set to the high level, in the second bit, the output node X1 is changed to the low level "0", and the next bit X2 is changed to "1". Subsequently, when the control signal PLUS is set to the high level, in a manner similar to the above, the output node Y1 in the latch circuit at the front side changes to 0, and the output node Y2 changes to 1. When the control signal PULS goes low, the clock signal LS also change, the output signal Z1 (Q1) of the latch circuit on the back side changes to 0, the output signal Z2 (Q2) changes to 1, and addition of +2 is executed.

When the addition signal AB2 goes low and the addition signal AB1 goes high, the output node X0 changes to the high level. When the control signal MINUS is set to the high level, the outputs Z0 to Z2 (Q0 to Q2) of the lower three bits are inverted, complement numbers are generated, and +1 of the AB1 is added. Consequently, the result of subtraction of −1 is derived. When the addition signal AB1 goes low, the addition signal AB2 goes high, and the control signal MINUS goes high, the outputs Z0 to Z2 (Q0 to Q2) of the lower three bits are inverted, a complement number is generated, +2 of the addition signal AB2 is added, and the result of subtraction of −2 is generated. Similarly, when the control signal HOLD is set to the high level, the result of calculation is maintained. When the control signal ZERO is generated, all of the outputs Z0 to Z3 and the like are cleared to 0.

For example, when an address step is set to +3, it can be realized by performing two cycles of +1 and +2, or two cycles of +4 and −1. The address step operation except for ±1, ±2, and ±4 can be arbitrarily set by the combination. An address can be generated in the testing operation by a relatively simple pattern. It can sufficiently correspond to the limited computing function as described above.

Figure 10:
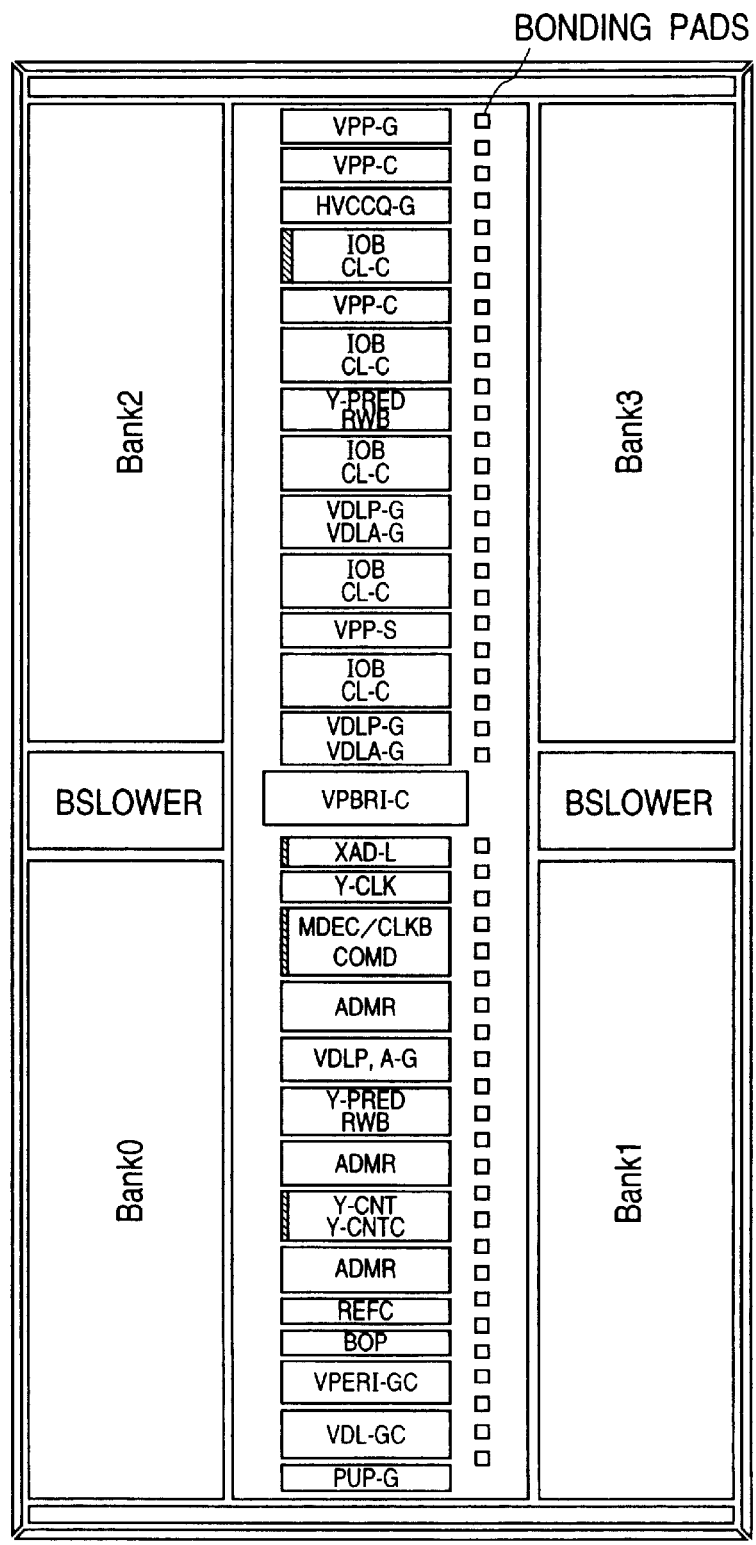
FIG. 10 is a schematic layout sketch showing an example of the SDRAM according to the invention.

FIG. 10 is a schematic layout sketch showing an example of the SDRAM according to the invention. Each circuit block in the diagram is formed on a single semiconductor substrate made of single crystal silicon or the like by a known technique of fabricating a semiconductor integrated circuit. The circuits in the diagram are drawn almost in accordance with a geometrical arrangement on the semiconductor substrate. In the embodiment, a memory array is divided into four pieces and memory banks Bank0 to Bank3 are formed.

The memory banks 0 to 3 are disposed in correspondence with the memory array divided into four pieces of two pieces each in the upper and lower sides and two pieces each in the right and left sides. In the center portion in the longitudinal direction of the chip, peripheral circuits including an address input circuit, and a data input/output circuit, and a line of bonding pads are provided. In the peripheral circuits, to rationalize the layout of the circuits which take the form of random logic circuits, the random logic circuits and bonding pads are disposed in parallel to each other.

In the example, the peripheral circuits and the bonding pad line are arranged in parallel to each other. In the configuration, the bonding pad line is disposed in a position deviated from the center line in the longitudinal direction of the semiconductor chip. As a result, in the center portion in the longitudinal direction of the semiconductor chip, a relatively large area can be assured, so that it is convenient to design the layout of the circuit device. That is, the configuration where the peripheral circuits and the bonding pad line are arranged in parallel is suitable for higher packing density and higher processing speed as compared with a configuration where peripheral circuits are disposed on the right and left sides of bonding pads as a center.

The next circuit block is provided in the center portion of the upper half in the longitudinal direction of the semiconductor chip in FIG. 10. VPP-G denotes a step-up voltage generating circuit used for an operation voltage of a selection circuit of a word line to which a memory cell is connected and a selection circuit of a shared switch MOSFET which will be described hereinlater to determine a selection level. VPP-C denotes a control circuit for controlling operations of the step-up voltage circuit.

HVCCQ-G indicates a circuit for generating a voltage obtained by dividing the source voltage VCC to the half. The obtained voltage is used as a reference voltage of an input buffer constructed by a differential circuit to determine the level (high or low) of an input signal of VCC amplitude. IOB and CL-C denote an input/output circuit and a clock control circuit, respectively. CL-C is used for an operation control adapted to CAS latency of an output buffer. Five sets of IOB and CL-C having similar circuit configurations are provided as a whole.

Y-PRED and RWB express a Y predecoder and a read/write buffer, respectively. The read/write buffer performs an operation control of a main amplifier and an operation of a sense amplifier. VDLP-G and VDLA-G denote step-down voltage generating circuits and generate a step-down operation voltage VDLP of the peripheral circuits and an operation voltage VDLA of a sense amplifier, respectively. Two more step-down voltage generating circuits similar to the above are provided. VPP-S denotes a VPP sensor for detecting whether a VPP voltage is a desired voltage or not. In the center portion of the semiconductor chip, a stabilization capacitor VPERI-C for stabilizing the step-down voltage VPERI is provided.

In the center portion of the lower half in the longitudinal direction of the semiconductor chip in the diagram, the following circuit blocks are provided. XAD-L denotes an X address latch circuit, Y-CLK indicates a Y clock circuit for generating a clock signal corresponding to a Y operation. MDEC/CLKB and COMD denote a mode decoder/clock buffer and a command circuit, respectively. ADMR denotes an address mode register. One more similar circuit is provided. Y-CNT and Y-CNC denote a Y counter and its control circuit, respectively. REFC denotes a refresh control circuit, BOP expresses a bonding option circuit, and PUP-G denotes a power-on detection circuit.

Along the plurality of circuit blocks as described above, bonding pads are arranged almost linearly. In the configuration, a signal transmission route in the circuit blocks is not made long undesirably to avoid the bonding pads but can be formed in shorter length as compared with the configuration where the periphery circuits ae disposed on the right and left sides. Consequently, the operation can be performed at higher speed. Since one circuit block can be formed so as to be concentrated in a large area, the layout of the circuit device on which automatic wiring is considered to be conducted is facilitated.

The test circuits are provided so as to be spread into the circuit blocks. For example, a circuit for capturing the four-bit test signal is added as shown by a hatched portion in IOB-CLC. The addition circuit ALU2 and a packet decoder corresponding to the circuit are disposed next to the address latch circuit XAD-L. The addition circuit ALU1 and a packet decoder corresponding to the circuit are provided next to the column address counter YCNT. MDEC/CLKB and COMB is also provided with a packet decoder designated by the packet signal. As described above, the test circuit is formed by dispersing its circuits to the circuit blocks having the circuit functions of the peripheral circuits, an increase in chip size can be prevented.

In the center portion in the minor-axis direction of the semiconductor chip, other peripheral circuits BSLOWER are provided. In the circuit BSLOWER, although not particularly limited, as will be described, a defect repair circuit for replacing a defect in a memory array (memory bank), that is, a defective word line with a spare word line or replacing a defective bit line with a spare bit line is provided.

Figure 11:
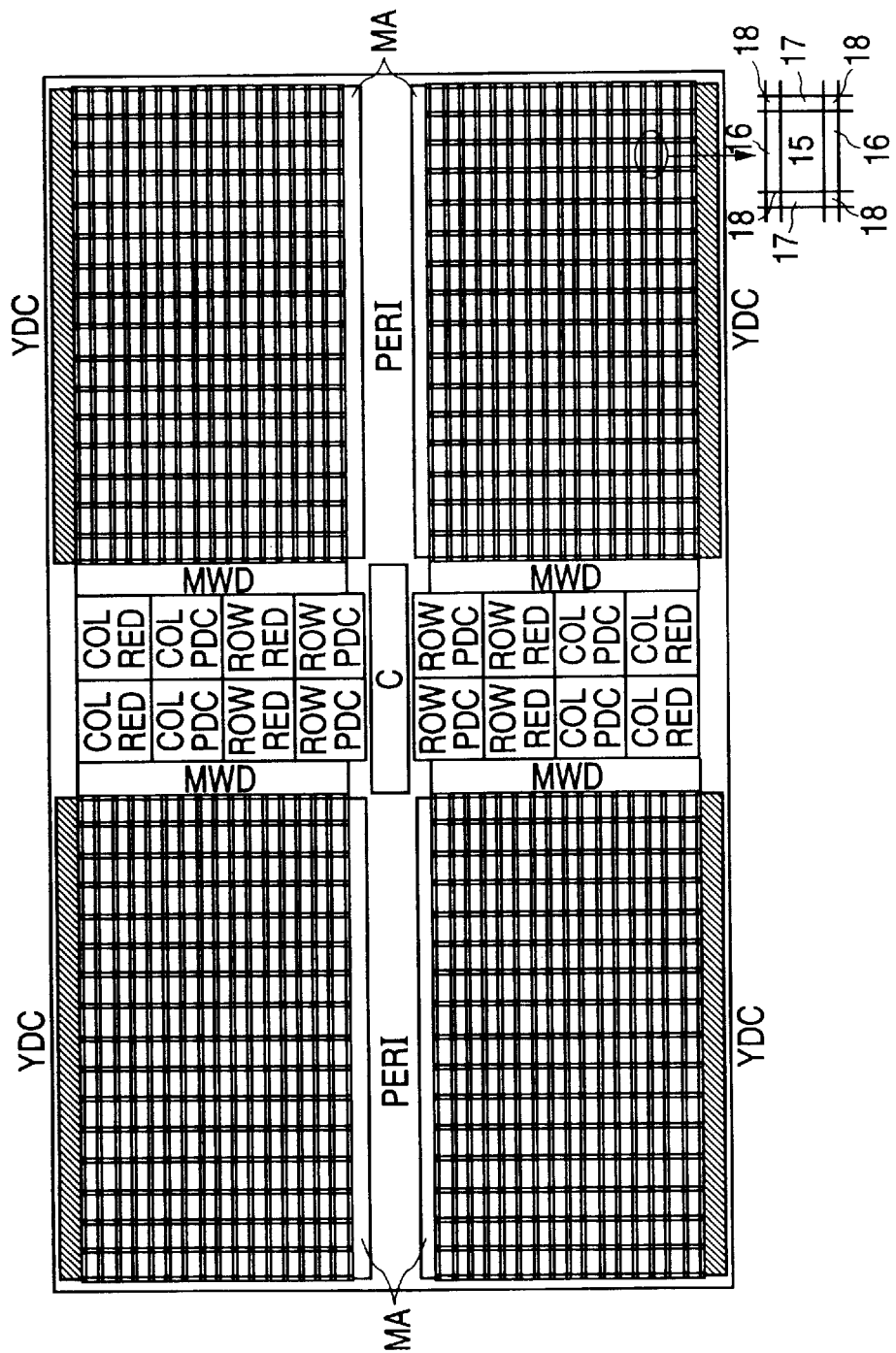
FIG. 11 is a schematic layout sketch showing an example of the SDRAM according to the invention.

FIG. 11 is a schematic layout sketch showing an example of the SDRAM according to the invention. In the diagram, the memory array is mainly drawn, which is divided into four memory arrays as a whole. Two memory arrays are disposed in each of the upper and lower sides in the longitudinal direction of the semiconductor chip and two memory arrays are disposed in each of the right and left sides. In a manner similar to the above, an input/output interface circuit PERI including an address input circuit, a data input/output circuit, and a bonding pad line is provided in the center portion along the longitudinal direction of the chip. In the center side of the memory arrays, main amplifiers MA are disposed.

In the total four memory arrays of two each on the upper and lower sides and two each on the right and left sides in the longitudinal direction of the semiconductor chip, in an intermediate portion in the lateral direction with respect to the longitudinal direction, an X predecoder circuit ROWPDC, an X repair circuit ROWRED, a Y predecoder circuit COLPDC, and a Y repair circuit COLRED are arranged in a lump. That is, two sets of the X predecoder circuits ROWPDC, X repair circuits ROWRED, Y predecoder circuits COLPDC, and Y repair circuits COLRED are provided in correspondence with the four memory arrays in which two each are provided on the right and left sides.

In a manner similar to the above, main word driver areas MWD are formed in the intermediate portion between the memory arrays, and main word lines provided so as to extend in the vertical direction are driven. In the configuration, in the case of using sub-arrays as described above, the main word line is extended so as to penetrate 16 sub-arrays. In the memory arrays, on the chip peripheral side opposite to the center portion of the chip, Y decoders YDC are provided. In the embodiment, the four memory arrays are disposed so as to be sandwiched by the main amplifiers MA disposed in the center side and the Y decoders YDC disposed on the peripheral sides. In this case, in the center area of the chip, there is a portion where interconnection channels extended in the vertical and lateral directions cross each other, and a stabilization capacitor C is formed in the portion. Stabilization capacitors each having a small capacitance value are properly provided so as to be spread in gaps in the peripheral circuits as described above.

In the memory arrays, although not particularly limited, the Y decoders YDC are provided on the chip peripheral sides opposite to the chip center portion. In the embodiment, each of the four memory arrays is disposed so as to be sandwiched by the main amplifier MA disposed on the center side and the Y decoder YDC disposed in the peripheral side. Each of the memory arrays is divided into a plurality of sub arrays 15. One of the sub arrays 15 is enlargedly shown. The sub array 15 is surrounded by sense amplifier areas 16 and sub word driver areas 17 arranged so as to sandwich the sub array 15. The intersection portion of the sense amplifier area 16 and the sub word driver area 17 is an intersection area 18. A sense amplifier provided in the sense amplifier area 16 is of a shared sense system. Except for sense amplifiers disposed at both ends of a memory cell array, complementary bit lines are provided on the right and left sides of the sense amplifier as a center and are selectively connected to either a right or left complementary bit line of the memory cell array.

One sub array 15 is constructed by, for example, not-illustrated 256 sub word lines and 256 pairs of complementary bit lines (or data lines) which perpendicularly cross the sub word lines. The sub array is also provided with spare word lines and spare complementary bit lines for repairing a defective word line or defective bit line. 16 sub arrays are provided in the word line disposing direction in a single memory array. As a whole, the sub word lines of about 4K are provided. Since the 16 sub arrays are provided in the bit line disposing direction, the complementary bit lines of about 4K are provided as a whole.

By selecting a sub word line and a pair of complementary bit lines in each of the 16 sub arrays corresponding to the main word lines, a memory access on the 16-bit unit basis is performed. As described above, 256 pairs of complementary bit lines are provided in the sub array. A column address signal such as A0 to A7 has eight bits. 256 sub arrays as described above are provided in the bit line direction and 16 sub arrays are provided in the memory bank. The number of sub word lines is therefore equal to (256×16=) 4096, and the row address signal comprises 12 bits as A0 to A11.

Since four such memory arrays are provided in an entire device, the storage capacity of (4×4K×4K=) 64 Mbits can be achieved in total. The length of the complementary bit line is divided into 16 parts in correspondence with the 16 sub arrays. The sub word line is divided into 16 in correspondence with the 16 sub arrays.

A sub word driver (sub word line driving circuit) 17 is provided for every sub array 15 as a part of the memory array. The sub word driver 17 is divided into parts each having the length of 1/16 of the main word line as described above and generates a selection signal of a sub word line extending in parallel with it. In the embodiment, in order to decrease the number of main word lines, in other words, in order to make the wiring pitch of the main word lines lower, although not particularly limited, four sub word lines are disposed in the complementary bit line direction per main word line. In order to select one of the sub word lines each divided into eight pieces in the main word line direction and four each are assigned in the complementary bit line direction, a sub word selection driver (not shown) is disposed in the main word driver MWD. The sub word selection driver generates a selection signal for selecting one of the four sub word selection lines extending in the disposing direction of the sub word driver.

In the case of employing the layout as shown in FIG. 11, when a Y address is entered, it is transmitted through an address buffer ADDBUP, and the repair circuit and the predecoder provided between the memory arrays to the Y decoder YDC disposed on the periphery side of the chip and the Y selection signal is generated. One of the sub array complementary bit lines is selected by the Y selection signal and the signal is transmitted to the main amplifier MA on the center side which is the opposite side of the chip, amplified, and outputted through a not-illustrated output circuit.

In the configuration, it seems that time required for a signal passing through a chip until a read signal is outputted is long. It is, however, necessary to supply the address signal as it is to the repair circuit, when the repair circuit is disposed in the center portion of the chip, after determining whether the address is that of a defect or not, output time of the predecoder is determined. That is, when the predecoder and the repair circuit are apart from each other, a signal delay between the predecoder and the repair circuit causes a delay in an actual Y selection operation.

In the embodiment, since the main amplifier MA and the Y decoder YCD are disposed on both sides of a memory array, the sum of a signal transmission path for selecting the complementary bit line of the sub array and the signal transmission path starting from the selected complementary bit line via an input/output line to the input of the main amplifier MA is equal to the signal transmission path only crossing the memory array irrespective of selection of any complementary bit line and can be reduced to the half of the path of one round trip as described above. Thus, the memory can be accessed at higher speed.

Figure 12:
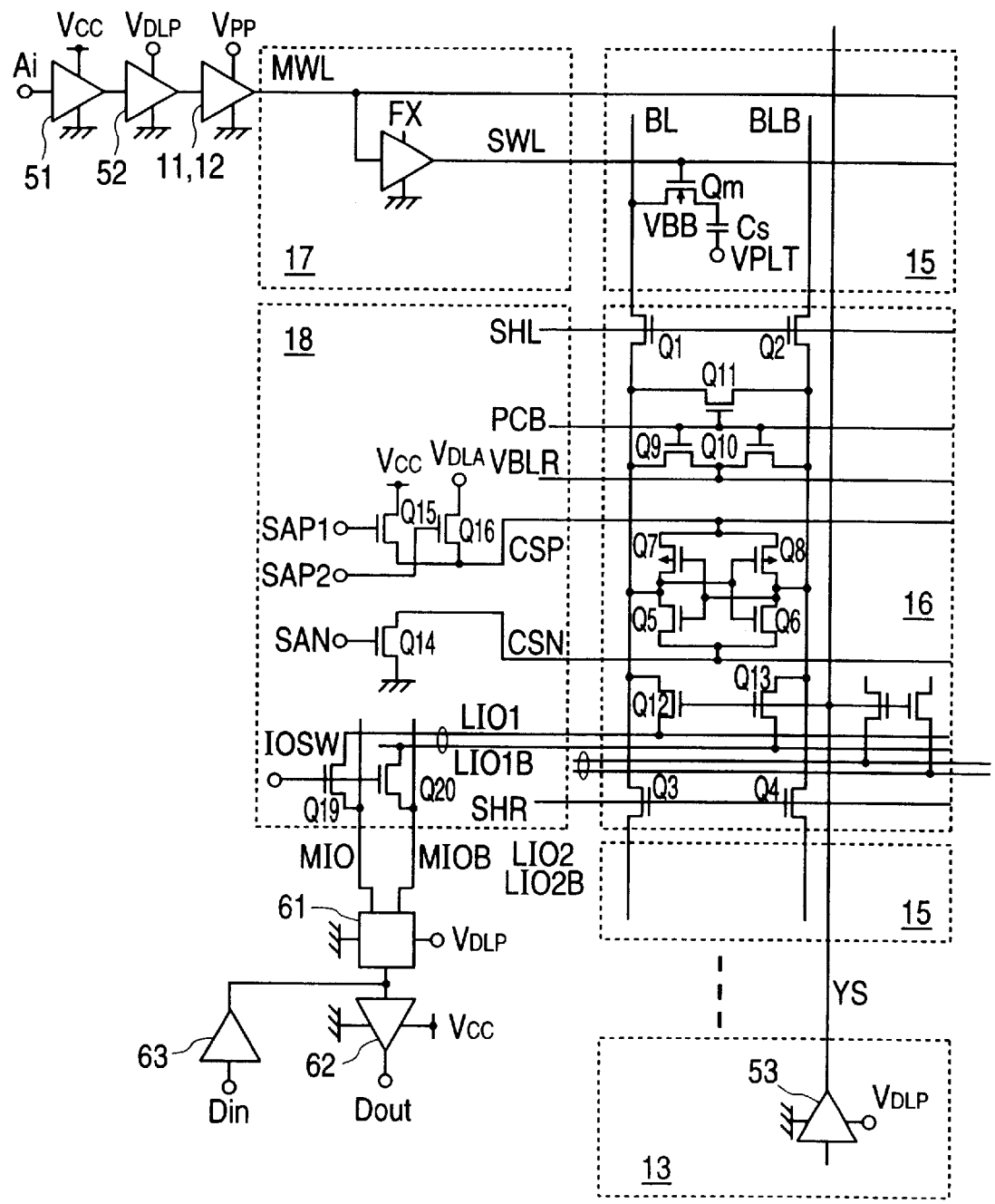
FIG. 12 is a circuit diagram showing a simplified example starting from address input until data output and mainly illustrating a sense amplifier of the SDRAM according to the invention.

FIG. 12 is a diagram showing an example of a simplified circuit from address input to data output and mainly showing a sense amplification section in the SDRAM according to the invention. In the diagram, circuits provided in the sense amplifier 16 and a cross area 18 sandwiched by two sub arrays 15 from the upper and lower sides are shown as an example, and the other portions are shown as blocks.

One dynamic memory cell provided between a sub-word line SWL provided for the sub array 15 and one (BL) of complementary bit lines BL and BLB is illustrated as an example. The dynamic memory cell includes an address selection MOSFET Qm and a storage capacitor Cs. The gate of the address section MOSFET Qm is connected to the sub word line SWL, the drain of the MOSFET Qm is connected to the bit line BL, and the storage capacitor Cs is connected to the source. The other electrode of the storage capacitor Cs is commonly used and a plate voltage VPLT is applied to the other electrode. A negative back bias voltage VBB is applied to the substrate (channel) of the MOSFET Qm. Although not particularly limited, the back bias voltage VBB is set to a voltage such as −1V. The selection level of the sub word line SWL is set to the high voltage VPP higher than the high level of the bit line only by the amount corresponding to the threshold voltage of the address selection MOSFET Qm.

In the case of operating the sense amplifier by the internal step down voltage VDLA, the high level amplified by the sense amplifier and given to the bit line is set to the internal voltage VDLA level. The high voltage VPP corresponding to the selection level of the word line is therefore set to VDLA+Vth+α. The pair of complementary bit lines BL and BLB of the sub array provided on the left side of the sense amplifier are disposed in parallel to each other as shown in the diagram. The complementary bit lines BL and BLB are connected to an input/output node of a unit circuit of the sense amplifier by shared switch MOSFETs Q1 and Q2.

The unit circuit of the sense amplifier takes the form of a CMOS latch circuit including n-channel type amplification MOSFETs Q5 and Q6 and p-channel type amplification MOSFETs Q7 and Q8 in a latch form in which the gates and the drains are connected so as to cross each other. The sources of the n-channel MOSFETs Q5 and Q6 are connected to a common source line CSN. The sources of the p-channel MOSFETs Q7 and Q8 are connected to a common source line CSP. A power switch MOSFET is connected to each of the common source lines CSN and CSP. Although not particularly limited, an operation voltage corresponding to the ground potential is applied by an n-channel power switch MOSFET Q14 provided in the cross area 18 to the common source line CSN to which the sources of the n-channel amplification MOSFETs Q5 and Q6 are connected.

Although not particularly limited, the common source line CSP to which the sources of the p-channel amplification MOSFETs Q7 and Q8 are connected is provided with an n-channel power MOSFET Q16 for overdrive provided in the cross area 18 and an n-channel power MOSFET Q15 for supplying the internal voltage VDLA. As a voltage for overdrive, although not particularly limited, the source voltage VCC supplied from an external terminal is used. Alternately, to lessen the dependency on the source voltage VCC of the sense amplifier operation speed, the voltage may be obtained from the source of the n-channel MOSFET having the gate to which VPP is applied and the drain to which the source voltage VCC is supplied and slightly decreased.

An activate signal SAP1 for sense amplifier overdrive to be supplied to the gate of the n-channel power MOSFET Q16 has the same phase as that of an activate signal SAP2 to be supplied to the gate of the n-channel MOSFET Q15, and SAP1 and SAP2 are set to the high level in time sequence. Although not particularly limited, the high level of SAP1 and SAP2 is equal to the step-up voltage VPP level. That is, since the step-up voltage VPP is about 3.6V, the n-channel MOSFETs Q15 and Q16 can be sufficiently turned on. After the off state of the MOSFET Q16 (low level of the signal SAP1), by the on state of the MOSFET Q15 (high level of the signal SAP2), a voltage corresponding to the internal voltage VDLA can be outputted from the source side.

The input/output node of the unit circuit of the sense amplifier is provided with a precharge (equalize) circuit including an equalize MOSFET Q11 for short-circuiting a complementary bit line and switch MOSFETs Q9 and Q10 for supplying a half precharge voltage VBLR to a complementary bit line. A precharge signal PCB is commonly supplied to the gates of the MOSFETs Q9 to Q11. Although not shown, in a driver circuit for generating the precharge signal PCB, an inverter circuit is provided in the cross area to make the driver circuit start at high speed. Specifically, at the time of start of memory access, prior to a word line selection timing, the MOSFETs Q9 to Q11 constructing the precharge circuit are switched at high speed via inverter circuits provided so as to be spread in the cross area.

In the cross area 18, an IO switch circuit IOSW (switch MOSFETs Q19 and Q20 for connecting a local IO and a main IO) is placed. Other than the circuits shown in FIG. 3, as necessary, a half precharge circuit for the common source lines CSP and CSN of the sense amplifier, a half precharge circuit of the local input/output line LIO, a VDL precharge circuit of the main input/output line, spread driver circuits of shared selection signal lines SHR and SHL, and the like are also provided.

The unit circuit of the sense amplifier is similarly connected to the complementary bit lines BL and BLB in the sub array 15 on the lower side of the diagram via shared switch MOSFETs Q3 and Q4. For example, when the sub word line SWL in the upper sub array is selected, the shared switch MOSFETs Q1 and Q2 on the upper side of the sense amplifier are turned on and the lower shared switches MOSFETs Q3 and Q4 are turned off. Switch MOSFETs Q12 and Q13 construct a column (Y) switch circuit. When the selection signal YS is set to the selection level (high level), the switch MOSFETs Q12 and Q13 are turned on to thereby connect the input/output node of the unit circuit of the sense amplifier with local input/output lines LIO1, LIO1B, LIO2, LIO2B, and the like.

Consequently, the input/output nodes of the sense amplifier are connected to the upper complementary bit lines BL and BLB, a small signal of a memory cell connected to the selected sub word line SWL is amplified, and the amplified signal is transmitted to the local input/output lines LIO1 and LIO1B via the column switch circuit (Q12 and Q13). The local input/output lines LIO1 and LIO1B extends along the sense amplifier line, that is, in the lateral direction of the diagram. The local input/output lines LIO1 and LIO1B are connected to main input/output lines MIO and MIOB to which an input terminal of a main amplifier 61 is connected via the IO switch circuit constructed by the n-channel MOSFETs Q19 and Q20 provided in the cross area 18.

The IO switch circuit is switched by a selection signal obtained by decoding an X address signal. The IO switch circuit may take the form of a CMOS switch in which p-channel MOSFETs are connected to the n-channel MOSFETs Q19 and Q20 in parallel. In a burst mode of a synchronous DRAM, the column selection signal YS is switched by a counter operation, thereby sequentially switching the connection between the local input/output lines LIO1 and LIO1B and the local input/output lines LIO2 and LIO2B and two pairs of complementary bit lines BL and BLB in the sub arrays.

An address signal Ai is supplied to an address buffer 51. The address buffer operates in a time division manner and receives an X address signal and a Y address signal. The X address signal is supplied to a predecoder 52 and passed through a main row decoder 11 and a main word driver 12, thereby generating a selection signal of a main word line MWL. Since the address buffer 51 receives the address signal Ai supplied from an external terminal, the address buffer 51 is operated by the source voltage VCC supplied from the external terminal. The predecoder is operated by the step-down voltage VDLP, and the main word driver 12 is operated by the step-up voltage VPP. As the main word driver 12, a logic circuit with level converting function for receiving the predecode signal which will be described hereinbelow is used. A column decoder (driver) 53 receives a Y address supplied by a time-divisional operation of the address buffer 51 and generates the selection signal YS.

The main amplifier 61 is operated by the step-down voltage VDLP, and a signal is outputted from an external terminal Dout via an output buffer 62 operated by the source voltage VCC supplied from an external terminal. A write signal entered from an external terminal Din is received via an input buffer 63 and is supplied to the main input/output lines MIO and MIOB via a write amplifier (write driver) included in the main amplifier 61 in the diagram. At an input section of the output buffer 62, a level converting circuit and a logic section for outputting an output signal of the level converting circuit synchronously with a timing signal corresponding to the clock signal are provided.

Although not particularly limited, the source voltage VCC supplied from the external terminal is set to 3.3V in the first embodiment, the step-down voltage VDLP supplied to an internal circuit is set to 2.5V, and the operation voltage VDLA of the sense amplifier is set to 2.0V. The selection signal (step-up voltage) of the word line is set to 3.6V. The precharge voltage VBLR of a bit line is set to 1.0V corresponding to VDL/2, and the plate voltage VPLT is also set to 1.0V. The substrate voltage VBB is set to −1.0V. The source voltage VCC supplied from the external terminal may be set to a low voltage such as 2.5V. At the time of a low source voltage VCC, the step-down voltage VDLP is set to 2.0V and the step-down voltage VDLA is set to be lowered to about 1.8V.

Figure 13:
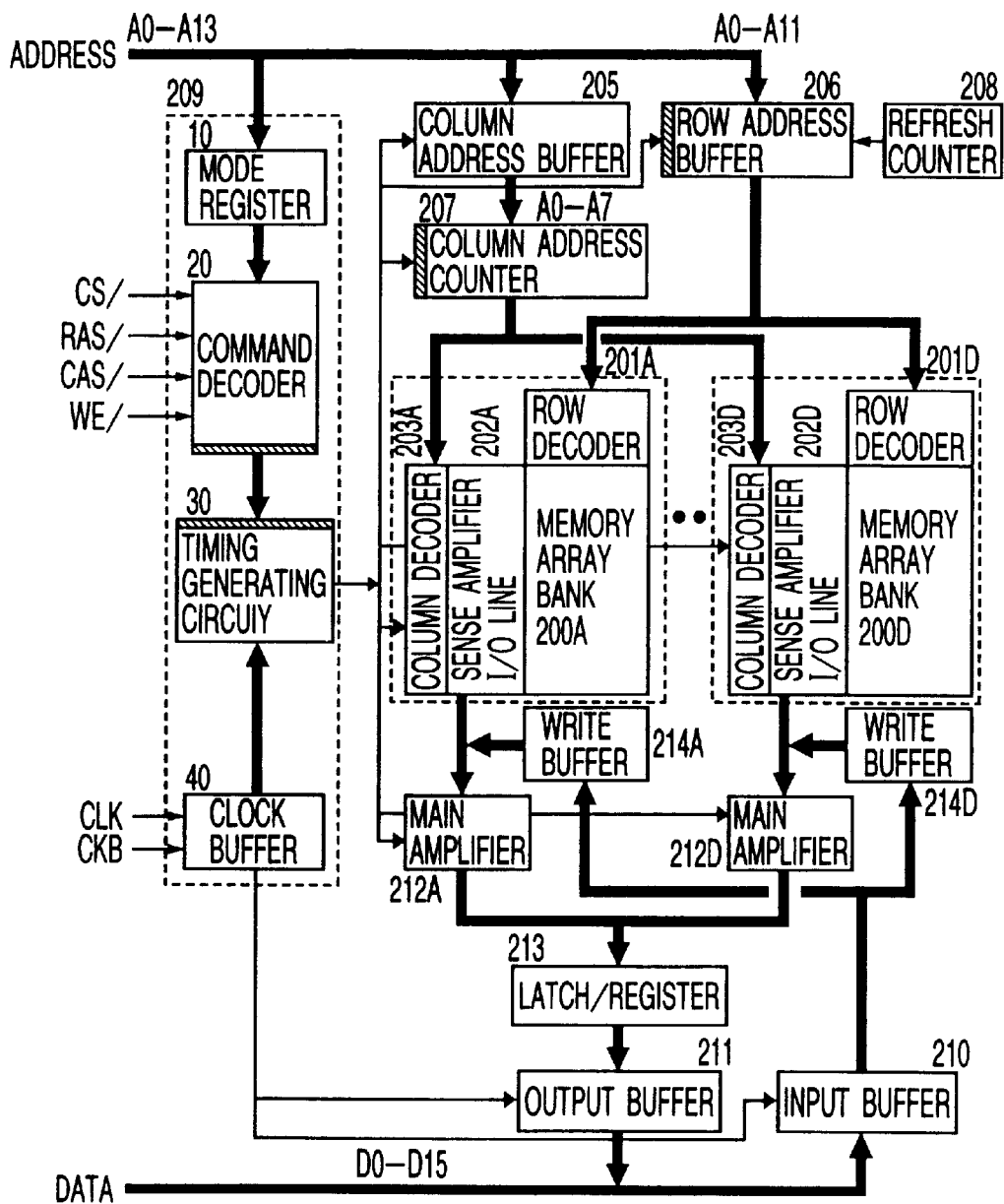
FIG. 13 is a general block diagram showing an example of the SDRAM according to the invention.

FIG. 13 is a general block diagram showing an example of an SDRAM according to the invention. Although not particularly limited, in the SDRAM of the embodiment, a memory array 200A constructing the memory bank 0 and a memory array 200D constructing the memory bank 3 out of the four memory banks are shown as an example. That is, the memory arrays 200B and 200C corresponding to two memory banks 1 and 2 out of the four memory banks are not shown. Each of the memory arrays 200A to 200D corresponding to the four memory banks 0 to 3 has dynamic memory cells arranged in a matrix as shown in each of the memory arrays 200A and 200D shown in the diagram as an example. According to the diagram, selection terminals of memory cells arranged in the same column are coupled to a word line (not shown) of each column, and data input/output terminals of the memory cells disposed in the same row are coupled to complementary data lines (not shown) every row.

One of not-illustrated word lines of the memory array 200A is driven to the selection level in accordance with a decode result of a row address signal by a row decoder 201A. A not-illustrated complementary data line in the memory array 200A is coupled to an I/O line 202A including a sense amplifier and a column selection circuit. The sense amplifier in the I/O line 202a including the sense amplifier and column selection circuit is an amplification circuit for detecting and amplifying a small potential difference appearing on each complementary data line by reading data from a memory cell. The column switch circuit is a switch circuit for selecting a complementary data line and making a complementary I/O line conductive. The column switch circuit is selectively operated in accordance with a result of decoding the column address signal by a column decoder 203A.

The memory arrays 200B and 200D are similar to the above. As shown in the memory array 200D as an example, a row decoder 201B, an I/O line 202B including a sense amplifier and a column selection circuit, and a column decoder 203B are provided. The complementary I/O lines are connected to output terminals of write buffers 214A and 214B and input terminals of main amplifiers 212A and 212B. Output signals of the main amplifiers 212A and 212B are transmitted to the input terminal of a latch/register 213, and an output signal of the latch/register 213 is outputted from an external terminal via an output buffer 211. A write signal entered from an external terminal is transmitted to the input terminals of the write buffers 214A and 214B via an input buffer 210. The external terminal is, although not particularly limited, a data input/output terminal for outputting data D0 to D15 of 16 bits. In correspondence with the memory arrays 200B and 200C which are not shown, main amplifiers and write buffers similar to the above are provided.

The address signals A0 to A13 supplied from the address input terminals are received in an address multiplex format by a column address buffer 205 and a row address buffer 206. The supplied address signal is held by each buffer. In a refresh operation mode, the row address buffer 206 receives a refresh address signal outputted from a refresh counter 208 as a row address signal. An output of the column address buffer 205 is supplied as preset data of a column address counter 207, and the column address counter 207 outputs a column address signal as the preset data or a value obtained by sequentially incrementing the column address signal to the column decoders 203A to 203D in accordance with an operation mode designated by a command or the like which will be described hereinlater.

A controller 209 shown by a dotted line receives, although not particularly limited, external control signals such as a clock signal CLK, a clock enable signal CKE, a chip select signal CS/, a column address strobe signal CAS/ (the sign/ denotes that a signal to which the sign/is attached is a row enable signal), a row address strobe signal RAS/, and a write enable signal WE/ and control data from the address input terminals A0 to A13, and generates internal timing signals for controlling an operation mode of the SDRAM and an operation of the circuit blocks on the basis of a change in level of each of the signals, timings, and the like. The controller 209 includes a mode register 10, a command decoder 20, a timing generation circuit 30, and a clock buffer 40.

The clock signal CLK is supplied via the clock buffer 40 to a clock synchronizing circuit 50 and an internal clock is generated. The internal clock is used, although not particularly limited, as a timing signal for making the output buffer 211 and the input buffer 210 active, and supplied to the timing generating circuit 30 where timing signals to be supplied to the column address buffer 205, row address buffer 206, and column address counter 207 are generated on the basis of the clock signal.

As the test circuit as shown by a hatched part, for example, the computing circuit ALIU2 and the packet decoder are assembled adjacent to an address latch included in the row address buffer 206, and the computing circuit ALU1 and the packet decoder are assembled in the column address counter. Packet decoders are disposed in correspondence with the command decoder 20 for generating control signals, the timing generating circuit 30, and the like. The function of receiving the packet signal is added to the input buffer 210. The packet control PC is added to the clock buffer 40.

An external input signal becomes significant synchronously with the leading edge of the internal clock signal. The chip select signal CS/ instructs the start of a command input cycle by its low level. When the high level (chip non-selection state) of the chip select signal CS/ is set, other inputs do not have any meaning. The selection state of a memory bank and an internal operation such as a burst operation are not influenced by a change to the chip non-selection state. The signals RAS/, CAS/, and WE/ have functions different from those of corresponding signals in an ordinary dynamic RAM and become significant when a command cycle which will be described hereinlater is defined.

The clock enable signal CKE is a signal for instructing the validity of the next clock signal. When the signal CKE is at the high level, the leading edge of the next clock signal is valid. When the signal CKE is at the low level, the leading edge of the next clock signal is invalid. In the read mode, in the case of providing an external control signal OE/ for performing output enable control on the output buffer 211, the signal OE/ is also supplied to the controller 209. For example, when the signal is at the high level, the output buffer 211 is set in a high output impedance.

The row address signal is defined by the level of A0 to A11 in a row address strobe bank active command cycle which will be described hereinlater synchronized with the leading edge of the clock signal CLK (internal clock signal).

The address signals A12 and A13 are regarded as bank selection signals in the row address strobe bank active command cycle. Specifically, by a combination of A12 and A13, one of the four memory banks 0 to 3 is selected. The control of selecting a memory bank can be carried out by, although not particularly limited, a process such as activation of only a row decoder on the selected memory bank side, selection of no column switch circuit on the not-selected memory bank side, connection to the input buffer 210 and output buffer 211 only on the selected memory bank side, or the like.

The column address signal is defined by the level of A0 to A7 in a cycle of a read or write command (a column address read command or a column address write command which will be described hereinlater) synchronized with the leading edge of the clock signal CLK (internal clock). That is, the column address signal is used to select one of the 256 pairs of complementary bit lines provided for the sub array as shown in FIG. 11. A column address defined in such a manner is used as a start address of a burst access.

Typified operation modes of an SDRAM instructed by commands will now be described.

(1) Mode Register Set Command (REG)

This is a command for setting the mode register 30. The command is designated by the low level of CS/, RAS/, CAS/, or WE. Data to be set (register set data) is supplied via A0 to A11. Although not particularly limited, the register set data is burst length, CAS latency, write mode, and the like. Although not particularly limited, burst lengths which can be set are 1, 2, 4, 8, and a full page, CSA latency which can be set is 1, 2, and 3, and write modes which can be set are burst write and single write modes.

The CAS latency denotes the number of cycles of an internal clock signal spent in a period from the trailing edge of the signal CAS/ until the outputting operation of the output buffer 211 in the reading operation instructed by the column address read command which will be described hereinlater. The internal operation time for reading data is necessary until read data is determined. The CAS latency is used to set the internal operation time in accordance with the use frequency of an internal clock signal. In other words, in the case of using an internal clock signal of a high frequency, the CAS latency is set to a relatively large value. In the case of using an internal clock signal of a low frequency, the CAS latency is set to a relatively small value.

(2) Bank Active Command (ACTV)

This is a command for instructing a row address strobe and making selection of a memory bank by A12 and A13 valid, and is instructed by the low level of CS/ and RAS/ and the high level of CAS/ and WE/. An address supplied to A0 to A11 at this time is captured as a row address signal and a signal supplied to A12 and A13 is captured as a memory bank selection signal. The capturing operation is performed synchronously with the leading edge of the internal clock signal as described above. For example, when the command is designated, a word line in a memory bank designated by the command is selected, and a memory cell connected to the word line is made conductive by corresponding complementary data lines. In the testing operation, A12 and A13 are made invalid and four memory banks are simultaneously accessed.

(3) Read Command (READ)

The command is a command necessary to start the burst reading operation and is a command for giving an instruction of the column address strobe. The command is instructed by the low level of CS/ and CAS/ and the high level of RAS/ and WE/. A column address supplied to A0 to A7 (in the case of a 16-bit configuration) is captured as a column address signal. The column address signal captured is supplied as a burst start address to the column address counter 207. In the burst reading operation instructed by the signal, a memory bank and a word line have been selected in the preceding row address strobe bank active command cycle. The memory cells of the selected word line are sequentially selected and continuously read in accordance with an address signal outputted from the column address counter 207 synchronously with the internal clock signal. The number of data continuously read is the number designated as the burst length. Reading of data from the output buffer 211 is started after the number of cycles of the internal clock signal specified by the CAS latency.

(4) Write Command (WRIT)

When the burst write mode is set in the mode register 10 as a mode of the writing operation, the write command is necessary to start the burst write operation. When the single write mode is set in the mode register 10 as a mode of the writing operation, the write command is necessary to start the single write operation. By the command, the column address strobe in the single write or burst write mode is instructed. The command is issued by the low level of CS/, CAS/ and WE/ and the high level of RAS/. An address supplied to A0 to A7 is captured as a column address signal. The column address signal captured is supplied as a burst start address to the column address counter 207 in the burst write mode. The procedure of the burst write operation instructed by the signal is similar to that of the burst read operation. In the writing operation, however, there is no CAS latency. Capturing of write data is started from the column address write command cycle.

(5) Precharge Command (PRE)

This is a command to start an operation of precharging a memory bank selected by A12 and A13 and is instructed by the low level of CS/, RAS/, and WE/, and the high level of CAS/.

(6) Automatic Refresh Command (CBR)

This is a command necessary to start automatic refresh and is instructed by the low level of CS/, RAS/, and CAS/, and the high level of WE/ and CKE.

(7) Burst Stop (BST)

This is a command necessary to stop the burst operation in a full page on all of memory banks. The command is ignored in burst operations except for the burst operation in a full page. The command is instructed by the low level of CS/ and WE/ and the high level of RAS/ and CAS/.

(8) No Operation Command (NOP)

This is a command for instructing that no substantial operation is performed and is instructed by the low level of CS/ and the high level of RAS/, CAS/, and WE/.

In the SDRAM, while a burst operation is performed in one memory bank, when another memory bank is designated and the row address strobe bank active command is supplied, without exerting an influence on the operation in the memory bank being subjected to the operation, a row address operation in the another memory bank can be performed. For example, the SDRAM has means for holding data, an address, and a control signal supplied from the outside. Although not particularly limited, the data to be held, particularly, an address and a control signal are held in each memory bank. Alternately, data of one word line in a memory block selected in the row address strobe bank active command cycle is preliminarily latched in the latch/register 213 for reading operation prior to a column operation.

For example, as long as the data D0 to D15 does not collide with each other at the data input/output terminal of 16 bits, during execution of a command of which process is not finished yet, the precharge command and the row address strobe bank active command can be issued to a memory bank different from the memory bank being processed by the command to start an internal operation in advance. The SDRAM in the embodiment performs the memory access on the 16-bit unit basis, has addresses of about 1M in which X addresses are A0 to A11 and Y addresses are A0 to A7, and includes four memory banks. Consequently, the SDRAM has a storage capacity of about 64 Mbits (=1 M×4 banks×16 bits) as a total.

Figure 14:
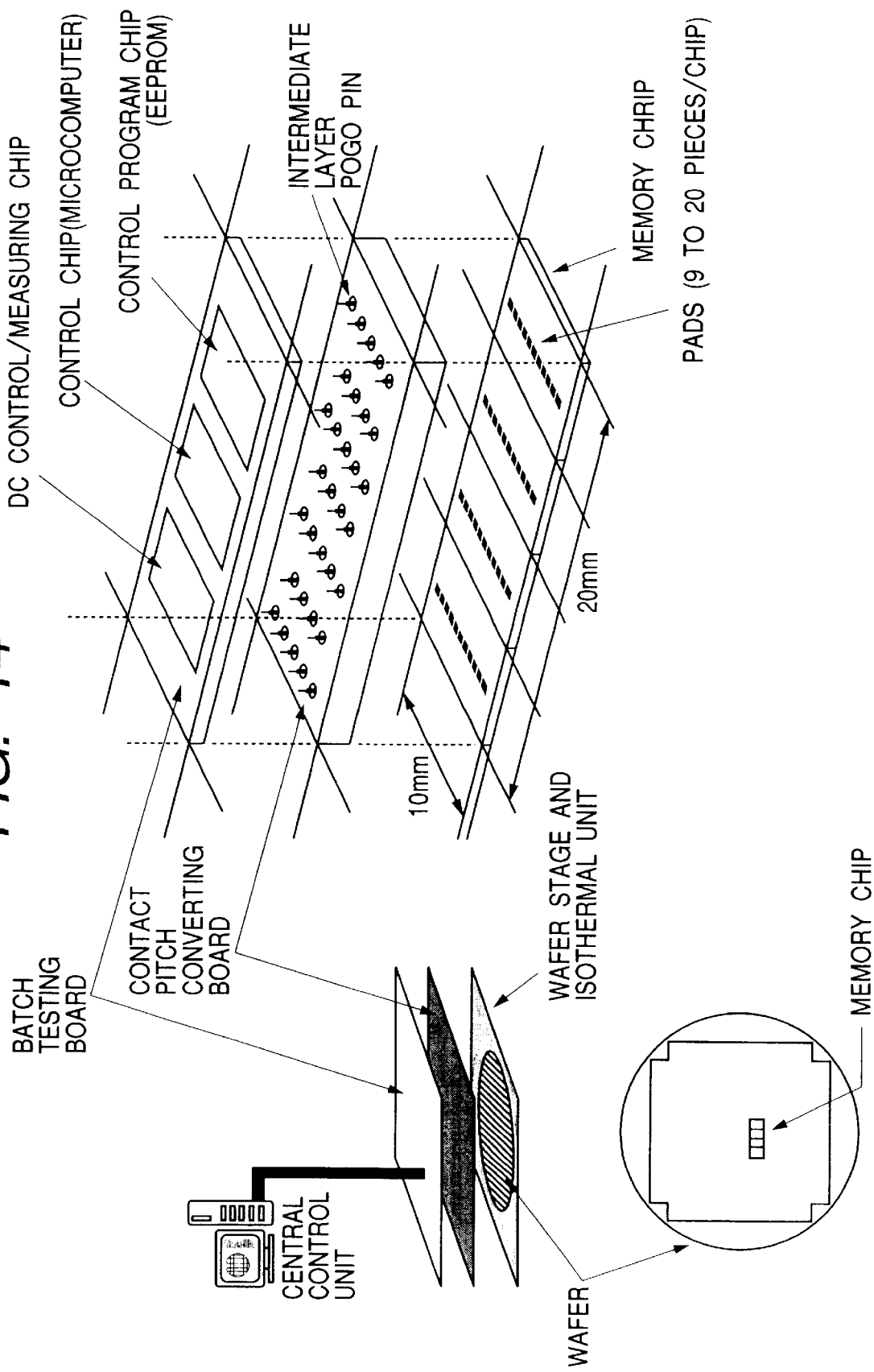
FIG. 14 is a schematic sketch for explaining a test system according to the invention.

FIG. 14 is a schematic configuration diagram showing an example of a test system according to the invention.

In a semiconductor memory device according to the invention, as described above, the number of electrodes for a test is set to a small value such as 15. For the small number of electrodes, consequently, an intermediate layer provided with POGO pins is prepared. Although not particularly limited, the intermediate layer is provided with POGO pins to come into contact with the pads for test on all of memory chips formed on a wafer. By the arrangement, electric contact can be simultaneously made to all of the memory chips on a wafer.

The POGO pins are contact pins protruding upward and downward from a substrate and moving in the axial direction by a spring. The POGO pins on the lower side of the intermediate layer come into electrical contact with pads for test of memory chips formed on the wafer. The intermediate layer functions as a contact pitch converting board and has pins protruding upward which comes into electrical contact with a batch testing board provided above via the pins.

On the batch testing board, a DC (DC control/measuring chip), a control chip such as a microcomputer for controlling the whole, and a control program chip such as an EEPROM in which the control program is stored are mounted. The three chips construct a testing circuit set. A plurality of testing circuit sets are mounted. The memory chips formed on the wafer are divided into a plurality of sets in correspondence with the plurality of testing circuits.

For the batch testing board, a central control unit is provided. A control program according to the function of the memory chip or the like is supplied from the central control unit to each of the testing circuits on the batch testing board, and a batch test on the memory chips formed on the wafer can be realized via the batch testing circuit.

When a plurality of the batch testing boards and a plurality of contact pitch converting boards are provided for the central control unit, a probing test can be conducted simultaneously on a plurality of wafers.

A wafer may be divided into a plurality of areas, and the intermediate layer and the batch testing circuit may conduct a simultaneous test only to memory chips provided in the divided area. In the case of conducting a batch test on the divided wafer, a test may be conducted on the other areas in a time division manner.

The actions and effects obtained from the embodiments are as follows.

(1) A memory circuit having a memory cell array in which a plurality of memory cells are provided at intersection points of a plurality of word lines and a plurality of bit line pairs and a peripheral circuit for performing an operation of selecting an address is provided with: a computing circuit for generating an address signal for test of the memory circuit; a packet decoder for designating the kind of computation to the computing circuit; and an input circuit for supplying a test signal comprising a plurality of bits for designating a testing operation to the packet decoder. Consequently, an effect such that the number of pads for test is reduced by adding a simple circuit and the number of chips to be simultaneously measured is largely increased, thereby enabling test time to be shortened is produced.

(2) The input circuit uses the number of bits smaller than the plurality of bits adapted to a memory access as the test signal in an input buffer adapted to the memory access on the unit basis of a plurality of bits. Therefore, an effect such that a test mode can be set and a test result can be outputted by using the smaller number of electrodes is obtained.

(3) The computing circuit and the packet decoder corresponding to the computing circuit are provided in correspondence with each of an X address signal and a Y address signal and are provided adjacent to circuits for holding the address signals at the time of memory access, thereby obtaining an effect such that the empty area in an existing circuit can be effectively used and higher packing density and higher operation speed can be realized.

(4) By further providing a packet control circuit for setting an input signal supplied via the input circuit as a test signal by a combination of predetermined control signals, an effect such that the circuit can be shared is produced.

(5) An operation control is performed on the semiconductor memory device by a command designated by a combination of a plurality of control signals and an address signal as necessary, a plurality of packet decoders including not only the packet decoder adapted to the computing circuit, but also a packet decoder for controlling a timing generation circuit, and a packet decoder adapted to control a command decoder for decoding the command are provided adjacent to the respective circuits, and the test signals are connected in parallel. Consequently, an effect such that the empty area in an existing circuit can be effectively used and higher packing density and higher operation speed can be realized is obtained.

(6) The semiconductor memory device is a synchronous dynamic RAM having four memory banks, and has a plurality of input/output circuits for inputting/outputting a plurality of data bits corresponding to a unit of memory access; and the test signal comprises four bits, and four input/output circuits out of input/output circuits corresponding to the plurality of data bits are used as an input circuit for receiving a test signal and an output circuit for outputting test results corresponding to the four memory banks. In such a manner, an effect such that commands optimum for a testing operation can be generated and a test result can be obtained by using the smaller number of pads is produced.

(7) By further providing a packet control circuit for setting an input signal supplied via the input circuit as a test signal by a combination of a clock signal and a control signal, an effect such that the existing input/output circuit can be effectively utilized is obtained.

(8) A command having a high use frequency of the synchronous dynamic RAM is used as a first format including only a test signal supplied first out of the four-bit test signals, a command having a use frequency lower than that of the first format out of commands of the synchronous dynamic RAM is used as a second format including a test signal supplied in two cycles out of the four-bit test signals, and a command for setting various registers provided for the synchronous dynamic RAM is used as a third format including a test signal supplied in four cycles out of the four-bit test signals. Consequently, an effect such that reduction in the number of terminals for test and various testing operations can be realized without deteriorating the speed of the testing operations is obtained.

(9) The first format includes a no-operation command, a bank active command, a read command, and a write command, and each of the bank active command, the read command, and the write command has a plurality of address controls performed by using the computing circuit. Consequently, an effect such that a testing operation can be set at speed as high as a normal operation is obtained.

(10) The second format instructs reference to a test signal to be supplied next in test signals supplied in the first cycle, and decodes the input test signal and generates the plurality of commands in the second cycle. Thus, an effect such that operation setting necessary for a testing operation can be assured without increasing substantial test time is produced.

(11) The third format instructs reference to a test signal to be supplied next by using the test signal supplied in the first cycle, sets the kind of a register by the test signal supplied in the second cycle, generates a register command by the test signal supplied in the third cycle, and operates the selected register by a test signal supplied in the fourth cycle. Consequently, an effect such that operation setting necessary for a number of testing operations can be assured with a simple circuit is obtained.

(12) The packet control circuit generates a first clock and a second clock obtained by dividing the frequency of the clock signal to the half, the first and third cycles for inputting the test signal are performed by the first clock, and the second and fourth cycles for inputting the test signal are performed by the second clock. Consequently, an effect such that various testing operations can be set with a simple circuit is obtained.

(13) A test system for a wafer on which a plurality of memory chips are mounted, each of the memory chips including: a memory cell array in which a plurality of memory cells are provided at intersection points of a plurality of word lines and a plurality of bit line pairs and a peripheral circuit for performing an operation of selecting an address, a computing circuit for generating an address signal for test of the memory circuit, a packet decoder for designating the kind of computation to the computing circuit, and an input circuit for supplying a test signal comprising a plurality of bits for designating a testing operation to the packet decoder. A plurality of POGO pins to be electrically contacted with which one ends of pads related to the test of a plurality of memory chips formed on the wafer are connected with a testing board on which a semiconductor integrated circuit device for control for generating various signals for a test on the plurality of memory chips is mounted via a contact pitch converting board having a plurality of POGO pins which come into electric contact with the other ends, and a central control unit for supplying a test control signal to the semiconductor integrated circuit device for control provided on the testing board is provided, thereby obtaining an effect such that a plurality of memory chips in electric contact can be measured simultaneously.

(14) The intermediate board comes into electrical contact with the test-related pads of all of memory chips formed on the wafer, and a plurality of semiconductor integrated circuit devices for control provided on the testing board are used to conduct a batch probing test on all of memory chips formed on the wafer, thereby obtaining an effect such that wafer batch testing can be realized.

Although the invention achieved by the inventor has been specifically described on the basis of the embodiments, obviously, the invention is not limited to the embodiments but can be variously modified. For example, as the input circuit for test, an address input circuit may be used. The number of bits of a packet signal of a test signal may be not only four as described above but also three or five. The semiconductor memory device is not limited to an SDRAM as described above but can be a dynamic RAM controlled by RAS/, CAS/, and WE/, or a static RAM.

INDUSTRIAL APPLICABILITY

The present invention can be widely applied to various semiconductor memory devices and test systems as described above.

What is claimed is:

1. A semiconductor memory device comprising:

a memory circuit having a memory cell array in which a plurality of memory cells are provided at intersection points of a plurality of word lines and a plurality of bit line pairs and a peripheral circuit which performs an operation of selecting an address;

an arithmetic circuit which generates an address signal to test said memory circuit;

a first packet decoder which designates the kind of operation to said arithmetic circuit; and an input and output circuit which supplies a test signal comprising a plurality of bits which designate a testing operation to said first packet decoder.

2. A semiconductor memory device according to claim 1, wherein said input and output circuit uses a number of bits for a test signal which is smaller than the plurality of bits needed for a memory access to said memory circuit.

3. A semiconductor memory device according to claim 1, wherein said arithmetic circuit and the packet decoder corresponding to said arithmetic circuit are provided in correspondence with each of an X address signal and a Y address signal and are provided adjacent to circuits which hold the address signals at the time of memory access.

4. A semiconductor memory device according to claim 2, further comprising a packet control circuit which sets an input signal supplied via said input and output circuit as a test signal by a combination of predetermined control signals.

5. A semiconductor memory device according to claim 1, further comprising:

a second packet decoder to control a timing generation circuit; and a third packet decoder to control a command decoder to decode said command, wherein an operation control is performed by a command designated by a combination of a plurality of control signals and an address signal, and wherein said first, second and third packet decoders are connected in parallel to a signal line through which said test signal is transmitted.

6. A semiconductor memory device according to claim 5, wherein said memory circuit is a synchronous dynamic RAM having four memory banks, wherein said input and output circuit has a plurality of input/output circuits each inputting/outputting a plurality of data bits corresponding to a unit of memory access, wherein said test signal comprises four bits, and wherein four of said plurality of input/output circuits are used as an input circuit to receive a test signal and as an output circuit to output test results corresponding to said four memory banks.

7. A semiconductor memory device according to claim 6, further comprising a packet control circuit which sets an input signal supplied via said input circuit as a test signal by a combination of a clock signal and a control signal.

8. A semiconductor memory device according to claim 7, wherein a command having a high use frequency of said synchronous dynamic RAM is used as a first format including only a test signal supplied first out of said four-bit test signals, wherein a command having a use frequency lower than that of said first format out of commands of said synchronous dynamic RAM is used as a second format including a test signal supplied in two cycles out of said four-bit test signals, and wherein a command to set various registers provided for said synchronous dynamic RAM is used as a third format including a test signal supplied in four cycles out of said four-bit test signals.

9. A semiconductor memory device according to claim 8, wherein said first format includes a no operation command, a bank active command, a read command, and a write command, and wherein each of said bank active command, said read command, and said write command has a plurality of address controls performed by using said arithmetic circuit.

10. A semiconductor memory device according to claim 8, wherein said second format instructs reference to a test signal to be supplied next by using the test signal supplied in the first cycle, decodes the test signal supplied in the second cycle, and generates said plurality of commands.

11. A semiconductor memory device according to claim 8, wherein said third format:

instructs reference to a test signal to be supplied next by using the test signal supplied in the first cycle, sets the kind of a register by the test signal supplied in the second cycle, generates a register command by the test signal supplied in the third cycle, and operates said selected register by a test signal supplied in the fourth cycle.

12. A semiconductor memory device according to claim 8, wherein said packet control circuit generates a first clock and a second clock obtained by dividing the frequency of said clock signal in half, wherein said first and third cycles to input said test signal are performed by said first clock, and wherein said second and fourth cycles to input said test signal are performed by said second clock.

13. A test system for a wafer on which a plurality of memory chips are mounted, comprising:

an intermediate board having a plurality of POGO pins with which one ends of pads related to said test of a plurality of memory chips formed on said wafer come into contact;

a testing board having an electrode coming into electrical contact with the other ends of the plurality of POGO pins provided for said intermediate board, on which a semiconductor integrated circuit device for control to generate various signals for a test on the plurality of memory chips is mounted; and a central control unit which supplies a test control signal to the semiconductor integrated circuit device for control provided on said testing board, wherein each of the memory chips comprises a memory circuit, an arithmetic circuit which generates an address signal to test said memory circuit, a packet decoder which designates the kind of operation to said arithmetic circuit, and an input circuit which supplies a test signal comprising a plurality of bits to designate a testing operation to said packet decoder, and wherein said memory circuit includes a memory cell array in which a plurality of memory cells are provided at intersection points of a plurality of word lines and a plurality of bit lines pairs, and a peripheral circuit to perform an operation selecting an address.

14. A test system according to claim 13, wherein said intermediate board comes into electrical contact with said test related pads on all of memory chips formed on said wafer, and wherein a plurality of semiconductor integrated circuit devices for control provided on said testing board are used to conduct a batch probing test on all of memory chips formed on the wafer.

* * * * *